(12) United States Patent
Ikegaya et al.

(10) Patent No.: US 9,906,327 B2
(45) Date of Patent: Feb. 27, 2018

(54) RECEIVING DEVICE, RECEIVING METHOD, AND PROGRAM

(71) Applicant: Sony Semiconductor Solutions Corporation, Kanagawa (JP)

(72) Inventors: Ryoji Ikegaya, Kanagawa (JP); Takashi Yokokawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/318,839

(22) PCT Filed: Jun. 23, 2015

(86) PCT No.: PCT/JP2015/067977
§ 371 (c)(1),
(2) Date: Dec. 14, 2016

(87) PCT Pub. No.: WO2016/002572
PCT Pub. Date: Jan. 7, 2016

(65) Prior Publication Data
US 2017/0141877 A1 May 18, 2017

(30) Foreign Application Priority Data
Jul. 3, 2014 (JP) .................................. 2014-137434

(51) Int. Cl.
*H04L 1/20* (2006.01)
*H04L 1/00* (2006.01)
(Continued)

(52) U.S. Cl.
CPC ............ *H04L 1/0054* (2013.01); *H04L 5/006* (2013.01); *H04W 52/0203* (2013.01); *H04L 1/0071* (2013.01)

(58) Field of Classification Search
CPC ... H04L 1/0045; H04L 1/0054; H04L 1/0071; H04L 5/006; H04W 52/0203; H03M 13/39; H03M 13/41
(Continued)

(56) References Cited

U.S. PATENT DOCUMENTS 5,852,630 A * 12/1998 Langberg ............ H04L 27/2647
375/219
7,093,180 B2 * 8/2006 Shin .................. H03M 13/2957
714/755
(Continued)

FOREIGN PATENT DOCUMENTS

JP 2002-353821 A 12/2002
JP 2013-207382 A 10/2013
(Continued)

OTHER PUBLICATIONS

Y. Narikiyo et al., "Improvement of HDTV . . . ," 2011 IEEE Symposium, pp. 1-24, Metropolitan Area Nureberg, Germany, Jun. 10, 2011.

*Primary Examiner* — Siu Lee
(74) *Attorney, Agent, or Firm* — Michael Best & Friedrich LLP

(57) ABSTRACT

The present disclosure relates to a receiving device, a receiving method, and a program that can reduce power consumption. A Viterbi decoding unit performs Viterbi decoding on a likelihood as a processing target, a byte de-interleaver delays a part of a decoding result of Viterbi decoding, and an RS decoding unit performs RS decoding on the decoding result after delaying by the byte de-interleaver. A likelihood converting unit controls decoding of the likelihood to improve reliability of the decoding result. Then, when all of a predetermined number of decoding results by the RS decoding unit are succeeded or failed, the decode stop determination unit determines to stop subsequent decoding on the likelihood as a processing target. The present technology may be applied to, for example, a receiving device that receives digital terrestrial broadcasting compatible with the ISDB-T standard, or the like.

13 Claims, 18 Drawing Sheets

(51) Int. Cl.
*H04W 52/02* (2009.01)
*H04L 5/00* (2006.01)

(58) Field of Classification Search
USPC .......................................... 375/316, 340, 341
See application file for complete search history.

(56) References Cited

U.S. PATENT DOCUMENTS

| | | | | |
|---|---|---|---|---|
| 7,886,209 | B2* | 2/2011 | Orio | H03M 13/2975 |
| | | | | 375/262 |
| 2003/0091129 | A1* | 5/2003 | Zhang | H03M 13/2975 |
| | | | | 375/340 |
| 2008/0304587 | A1* | 12/2008 | Setoh | H04L 27/2662 |
| | | | | 375/260 |
| 2009/0249165 | A1* | 10/2009 | Gracie | H03M 13/296 |
| | | | | 714/758 |
| 2010/0223524 | A1* | 9/2010 | Duggan | H03M 13/3707 |
| | | | | 714/751 |
| 2015/0039964 | A1* | 2/2015 | Fonseka | H04L 1/0041 |
| | | | | 714/756 |

FOREIGN PATENT DOCUMENTS

| | | |
|---|---|---|
| JP | 2013-251691 A | 12/2013 |
| WO | 00/052832 A1 | 9/2000 |

\* cited by examiner

US 9,906,327 B2

RECEIVING DEVICE, RECEIVING METHOD, AND PROGRAM

TECHNICAL FIELD

The present disclosure relates to a receiving device, a receiving method and a program, and more particularly, relates to a receiving device, a receiving method, and a program that can reduce power consumption.

BACKGROUND ART

First generation digital terrestrial broadcasting standards include integrated services digital broadcasting-terrestrial (ISDB-T), digital video broadcasting-terrestrial (DVB-T), advanced television systems committee (ATSC), integrated services digital broadcasting-satellite (ISDB-S), digital video broadcasting-satellite (DVB-S), and the like which use a Reed Solomon (RS) code as an external code and a convolutional code as an internal code of an error correcting code.

In addition, practical use of second generation terrestrial digital broadcasting standards including digital video broadcasting-terrestrial 2 (DVB-T2), digital video broadcasting-cable 2 (DVB-C2), digital video broadcasting-satellite 2 (DVB-S2), and the like which use Bose Chaudhuri Hocquenghem (BCH) as an external code and low density parity check (LDPC) as an internal code of an error correcting code has begun.

In the related art, an error correcting unit of a receiving device compliant with a first generation terrestrial digital broadcasting standard is implemented by a pipeline connection of a Viterbi decoding unit, a convolutional de-interleaver, and an RS decoding unit. However, recently, stable reception of digital terrestrial broadcasting has been required even for moving objects. Therefore, a diversity receiving technique, an error correction technique, and the like have been studied to increase reception performance.

For example, in the ISDB-T standard, in order to increase reception performance, introducing a space diversity technique using a plurality of receiving antennas and a concept of iterative decoding to the error correcting unit has been devised (for example, refer to Non-Patent Document 1).

For example, in an error correction unit of a related receiving device, since a likelihood of a bit succeeded in RS decoding among likelihoods of respective bits to which Viterbi decoding is performed becomes a likelihood that is closest to an encoding bit, a difference of a branch metric of branches in a trellis corresponding to the bit is large. Therefore, a survival path can be selected more accurately and a positive decoding probability of Viterbi decoding is improved. Further, since the decoding result of Viterbi decoding having an improved positive decoding probability is de-interleaved and becomes a part of the RS code word input to the RS decoding unit, the positive decoding probability of RS decoding is improved. As a result, reception performance is improved. Then, such an effect further increases when Viterbi decoding and RS decoding are repeated.

Further, the applicant of the present application proposes a receiving device that can reduce a memory used in an error correction process by that the likelihood converting unit controls decoding of a likelihood to improve reliability of a decoding result by using decoding results which are not delayed among decoding results after the delay by the byte de-interleaver (for example, refer to Patent Document 1).

CITATION LIST

Patent Document

Patent Document 1: Japanese Patent Application Laid-Open No. 2013-251691

Non-Patent Document

Non-Patent Document 1: Y. Narikiyo and M. Takada, "Improvement of HDTV mobile reception performance for ISDB-T by 8-branch space diversity with iterative decoding" in IEEE International Symposium on Broadband Multimedia Systems and Broadcasting (BMSB 2011), Nurnberg, Germany, June 2011.

SUMMARY OF THE INVENTION

Problems to be Solved by the Invention

Here, according to the error correction unit of the above described related receiving device, there may be a case that consumed power increases by continuing operation by the Viterbi decoding unit and RS decoding unit even in a condition that the positive decoding probability of the Viterbi decoding unit is not increased.

The present disclosure has been made in view of the above situation and provided to reduce power consumption.

Solutions to Problems

A receiving device according to an aspect of the present disclosure that receives data encoded with "n" number ("n" is an integer greater than 1) of codes, wherein regarding the data, "a" piece ("a" is an integer equal to or greater than 1) of data out of original data before encoding or the data encoded with the "n" number of codes are encoded by encoding with a subsequent code after an interleaving process is performed, the receiving device includes "n" number of decoding units, "a" number of delay unit, a reliability increasing unit, and a decode stop determination unit, the "n" number of decoding units decode the respective "n" number of codes, the "a" number of delay unit performs inverse conversion of the interleaving process on the data output from the decoding units, corresponding to the codes for encoding each "a" piece of data on which the interleaving process is performed, the reliability increasing unit controls decoding of the encoded data to improve reliability of decoding results by using a part or all of the decoding results of the respective decoding units or a part or all of the data output from the respective delay units, and the decode stop determination unit determines whether or not to stop subsequent decoding on the encoded data as a processing target by controlling decoding by the reliability increasing unit using a part or all of the respective decoding results of the decoding units or a part or all of the data output from the delay units.

The receiving method or program according to an aspect of the present disclosure is a control method of a receiving device that receives data encoded with "n" number ("n" is an integer greater than 1) of codes or a program that causes a computer, which controls a receiving device that receives data encoded with "n" number ("n" is an integer greater than 1) of codes, to execute. The steps include encoding the data by encoding, with a subsequent code, "a" piece ("a" is an integer equal to or greater than 1) of data out of original data before encoding or the data encoded with the "n" number of codes after an interleaving process is performed, decoding the respective "n" number of codes, performing inverse conversion of the interleaving process on the data output corresponding to the codes for encoding the respective "a" piece of data on which the interleaving process is performed, controlling decoding of the encoded data to improve reliability of decoding results by using a part or all of the decoding results using the respective "n" number of codes or a part or all of the data on which inverse conversion of the interleaving process is performed respectively, and determining whether or not to stop subsequent decoding on the encoded data as a processing target by controlling decoding of the encoded data by using a part or all of the decoding results using the respective "n" number of codes or apart or all of the data on which inverse conversion of the interleaving process is performed respectively.

According to an aspect of the present disclosure, regarding the data, "a" piece ("a" is an integer equal to or greater than 1) of data out of original data before encoding or data encoded with "n" number ("n" is an integer greater than 1) of codes is encoded so that an interleaving process is performed. Then, the "n" number of codes are decoded and inverse conversion of the interleaving process is performed on the data output from a decoding units, corresponding to the codes for encoding the respective "a" piece of data on which the interleaving process is performed. After that, decoding of the encoded data is controlled to improve reliability of the decoding results by using a part or all of the decoding results using the respective "n" number of codes or a part or all of the data on which inverse conversion of the interleaving process is performed respectively. Then, it is determined whether or not to stop subsequent decoding on the encoded data as a processing target by controlling decoding of the encoded data by using a part or all of the decoding results using the respective "n" number of codes or a part or all of the data on which inverse conversion of the interleaving process is performed respectively.

Effects of the Invention

According to an aspect of the present disclosure, the power consumption can be reduced.

MODE FOR CARRYING OUT THE INVENTION

Hereinafter, a specific embodiment to which the present technology is applied will be described in detail with reference to the drawings.

Embodiment

[Configuration Example of Embodiment of Receiving Device]

Figure 1:
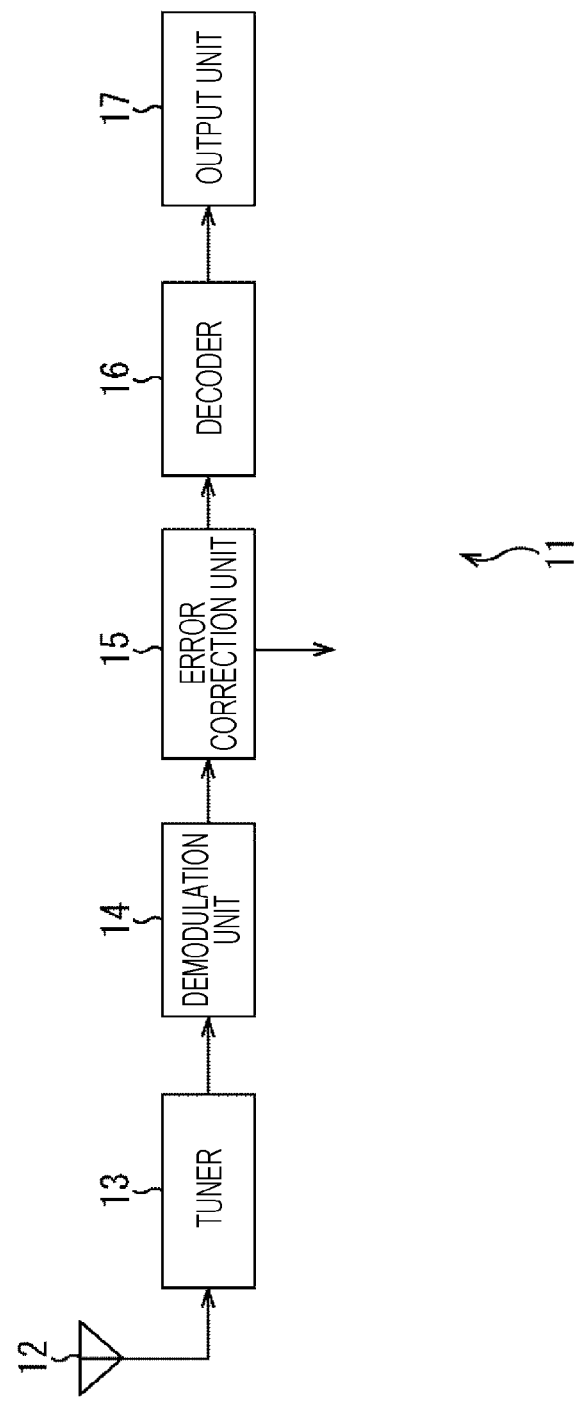
FIG. 1 is a block diagram illustrating a configuration example of an embodiment of a receiving device to which the present technology is applied.

FIG. 1 is a block diagram illustrating a configuration example of an embodiment of a receiving device to which the present technology is applied.

The receiving device 11 illustrated in FIG. 1 is, for example, a receiving device compatible with the ISDB-T standard and includes an antenna 12, a tuner 13, a demodulation unit 14, an error correction unit 15, a decoder 16, and an output unit 17. The receiving device 11 receives and decodes RF signals of digital terrestrial broadcasting compatible with the ISDB-T standard.

More specifically, the antenna 12 serves as a reception unit. The antenna 12 receives RF signals transmitted from an unillustrated transmission device such as a broadcast station via a communication path and supplies the RF signals to the tuner 13.

The tuner 13 performs a frequency conversion on the RF signals received by the antenna 12. IF signals, which are obtained by performing a frequency conversion on the RF signals, are supplied to the demodulation unit 14.

After performing an A/D conversion on the IF signals provided from the tuner 13, the demodulation unit 14 performs a multi-value demodulation and a demapping process and generates a likelihood. The demodulation unit 14 supplies, to the error correction unit 15, the likelihood as encoded data encoded with an external code and an internal code.

The error correction unit 15 performs an error correction process on the likelihood supplied from the demodulation unit 14 and supplies the data obtained as a result to the decoder 16. Further, the error correction unit 15 outputs, to outside, a number of bit errors within a predetermined period of time.

The decoder 16 decodes the data supplied from the error correction unit 15 with a moving picture experts group phase (MPEG) system for example and supplies the image or sound data obtained as a result to the output unit 17.

The output unit 17 is composed of a display, a speaker, or the like. The display displays an image according to image data supplied from the decoder 16 and the speaker outputs sound according to sound data.

[First Configuration Example of Error Correction Unit]

Figure 2:
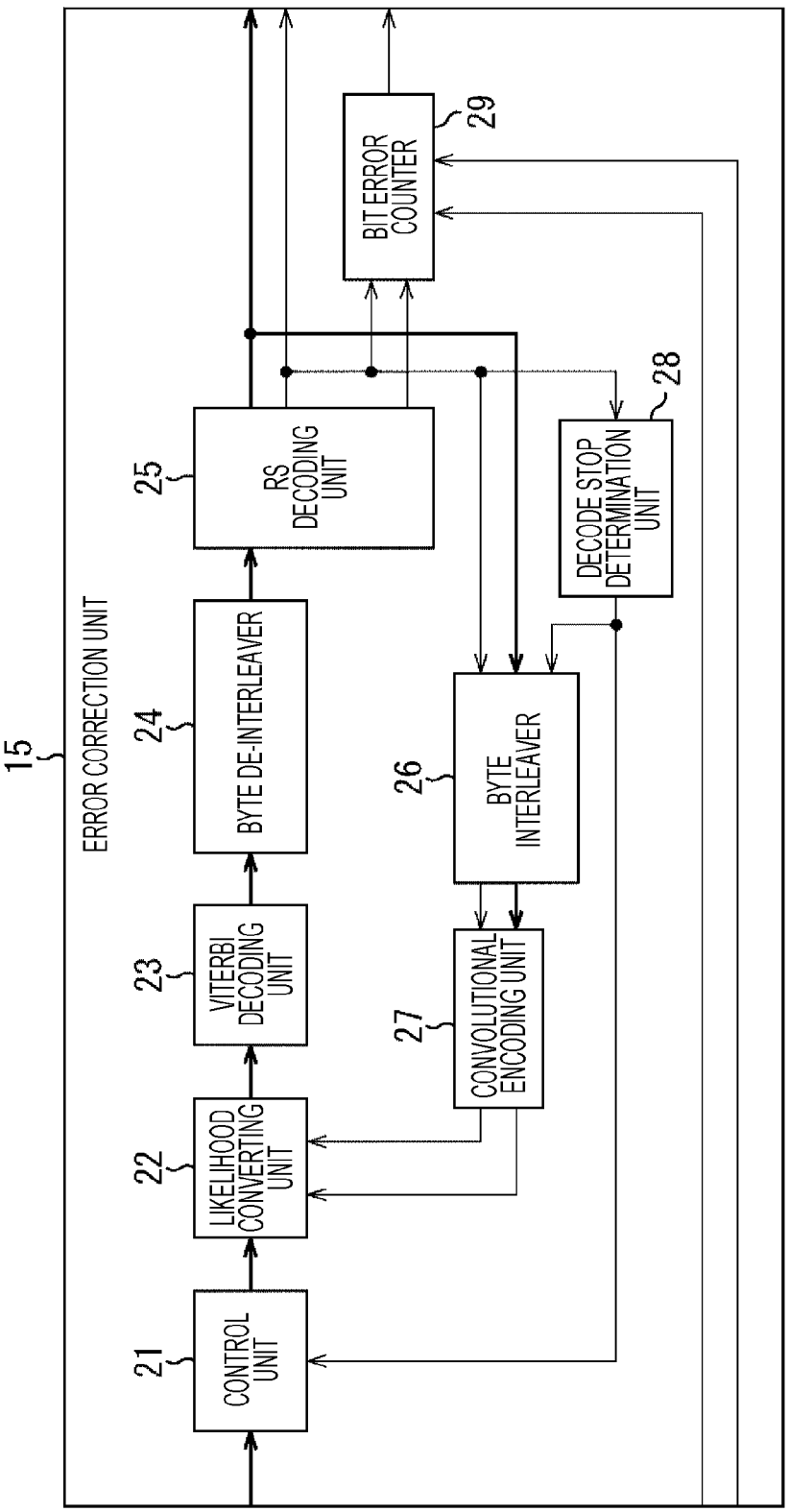
FIG. 2 is a block diagram illustrating a first configuration example of an error correction unit of FIG. 1.

FIG. 2 is a block diagram illustrating a first configuration example of the error correction unit 15 of FIG. 1.

As illustrated in FIG. 2, the error correction unit 15 is provided with a control unit 21, a likelihood converting unit 22, a Viterbi decoding unit 23, a byte de-interleaver 24, an RS decoding unit 25, a byte interleaver 26, a convolutional encoding unit 27, a decode stop determination unit 28, and a bit error counter 29. Then, the error correction unit 15 realizes iterative decoding in which the Viterbi decoding unit 23 and RS decoding unit 25 exchange information.

To the control unit 21 of the error correction unit 15, the likelihood, on which a multi-value demodulation and a demapping process are processed, is input bit by bit from the demodulation unit 14 of FIG. 1. The control unit 21 has an internally mounted memory and temporarily stores the input likelihood to read out the same likelihood more than one time. Then, the control unit 21 reads the likelihood from the internal memory and supplies the likelihood to the likelihood converting unit 22 at a necessary timing.

For example, in the error correction unit 15, using a certain number Nlr of likelihoods as one unit of decoding, decoding is repeated for each unit of decoding, and the control unit 21 reads the likelihood from the memory for each unit of decoding and supplies the likelihood to the likelihood converting unit 22. Here, in a case of the ISDB-T for example, one unit of decoding is the number of likelihoods corresponding to information bits of an amount of eleven packets and decoding is repeated on the Nlr number of likelihoods for a predetermined number of times.

Here, the convolutional code of the ISDB-T standard has a code rate of ½, and a code bit of two bits corresponds to an information bit of one bit. Therefore, the control unit 21 provides a likelihood of two bits corresponding to the 1-bit information bit to the likelihood converting unit 22. Further, hereinbelow, when it is necessary to particularly distinguish the likelihoods of two bits, a likelihood #1 and a likelihood #2 are used.

The likelihood converting unit 22 converts the likelihood #1 provided from the control unit 21 on the basis of an encoding bit #1 provided from the convolutional encoding unit 27 and reliability information of the encoding bit #1. Similarly, the likelihood converting unit 22 converts the likelihood #2 provided from the control unit 21 on the basis of an encoding bit #2 provided from the convolutional encoding unit 27 and reliability information of the encoding bit #2.

Also, hereinbelow, when it is not unnecessary to particularly distinguish between the encoding bit #1 corresponding to the likelihood #1 and the encoding bit #2 corresponding to the likelihood #2, these are collectively called an encoding bit. Similarly, reliability information #1 and reliability information #2 are collectively called reliability information.

More specifically, when a level of the reliability information is an H level indicating that the information is reliable, the likelihood converting unit 22 sets a likelihood that is closest to a value of the encoding bit set in advance as a converted likelihood. On the other hand, when a level of the reliability information is an L level indicating that the information is unreliable, the likelihood provided from the control unit 21 is set as a converted likelihood. The likelihood converting unit 22 provides the converted likelihood to the Viterbi decoding unit 23.

The Viterbi decoding unit 23 performs Viterbi decoding on the likelihood provided from the likelihood converting unit 22 and provides a bitwise decoding result to the byte de-interleaver 24.

The byte de-interleaver 24 converts the bitwise decoding result provided from the Viterbi decoding unit 23 into a bytewise decoding result. Also, the byte de-interleaver 24 serves as a delay unit and performs de-interleaving by delaying a part of the bytewise decoding result obtained as a conversion result. Here, in the ISDB-T standard, the number of branches of the byte interleaver is 12 and an i-th (i=1, . . . , and 12) branch includes a memory having a depth of (i−1)×17. The byte de-interleaver 24 is configured to correspond to the byte interleaver.

The RS decoding unit 25 performs RS decoding on the bytewise decoding result de-interleaved by the byte de-interleaver 24. The RS decoding unit 25 outputs decoded data obtained as a result and a decoding success flag indicating whether decoding is successful to the outside, and provides the result to the byte interleaver 26. Further, the RS decoding unit 25 provides the decoding success flag to the decode stop determination unit 28.

The byte interleaver 26 is a byte interleaver in the ISDB-T standard, and the number of branches is 12 and an i-th (i=1, . . . , and 12) branch includes a memory having a depth of (i−1)×17 as described above. The byte interleaver 26 performs bytewise interleaving by associating the decoded data with the decoding success flag provided from the RS decoding unit 25. The byte interleaver 26 provides the interleaved bytewise decoded data and decoding success flag to the convolutional encoding unit 27.

When first reading of the likelihood is performed by the control unit 21, the convolutional encoding unit 27 provides a predetermined value as the encoding bit and reliability information of the L level to the likelihood converting unit 22. On the other hand, when second or subsequent reading of the likelihood is performed by the control unit 21, the convolutional encoding unit 27 performs convolutional coding by generating the encoding bit on the basis of the bytewise decoded data provided from the byte interleaver 26. In addition, the convolutional encoding unit 27 generates reliability information on the basis of the decoding success flag. Then, the convolutional encoding unit 27 provides the encoding bit and the reliability information to the likelihood converting unit 22.

The decode stop determination unit 28 generates a decoding stop flag indicating whether to end the decoding on the basis of the decoding success flag provided from the RS decoding unit 25 and provides the decoding stop flag to the control unit 21 and byte interleaver 26.

For example, when the all the data stored in the memory for byte interleaving is successful in RS decoding, or when all the data is failed in RS decoding, the decode stop determination unit 28 generates a decoding stop flag indicating to stop decoding. In other words, when all the data stored in the memory for byte interleaving is successful or failed in RS decoding, it is assumed that a positive decoding probability after Viterbi decoding is not changed even when decoding is further repeated on the likelihood of one unit of decoding as a processing target. Accordingly, when the positive decoding probability after Viterbi decoding is not changed by repeating decoding, it is assumed to be unnecessary to continue accesses to the Viterbi decoding unit 23 or the memory and the operation by the RS decoding unit 25 so that the consumed power can be suppressed by stopping those operations.

Thus, the decode stop determination unit 28 detects whether the decoding success flags provided from the RS decoding unit 25 are in an H level indicating a decode success or in an L level indicating a decode failure as many as the number of packets (the number of RS code words) corresponding to the capacity of the memory for byte interleaving. With this configuration, the decode stop determination unit 28 can recognize that all the data stored in the memory for byte interleaving is successful in RS decoding or that all the data is failed in RS decoding. In other words, the decoding stop flag is a result of detecting whether the decoding success flag is the H level or L level as many as the number of packets corresponding to the capacity of the memory for byte interleaving.

In this manner, the decode stop determination unit 28 generates a decoding stop flag and provides the decoding stop flag to the control unit 21 and byte interleaver 26.

Thus, the control unit 21 receives decoding stop flags provided from the decode stop determination unit 28 and, when the decoding stop flag is the H level, stops decoding on the likelihood in the unit of decoding as a current processing target even if the number of decoding has not reached the predetermined number of times. Here, in the error correction unit 15, the timing to stop decoding is after outputting the likelihood in the current unit of decoding. Then, after stopping decoding the likelihood in the unit of decoding, which is a current processing target, the error correction unit 15 starts to decode a next unit of decoding as a processing target. On the other hand, in a case that the decoding stop flag provided from the decode stop determination unit 28 is the L level, the control unit 21 repeats decoding the same likelihood when the number of decoding has not reached the predetermined number of times and starts decoding likelihood in a next unit of decoding as a processing target when the number of decoding has reached the predetermined number of times.

Further, the byte interleaver 26 receives the decoding stop flag provided from the decode stop determination unit 28 and stops access (writing and reading) to the memory for interleaving when the decoding stop flag is the H level. On the other hand, when the decoding stop flag provided from the decode stop determination unit 28 is the L level, the byte interleaver 26 performs interleaving byte by byte as described above.

The bit error counter 29 serves as a calculating unit. The bit error counter 29 accumulates the number of error bits on the basis of the decoding result output from the RS decoding unit 25 including the decoding success flag and the number of corrected bits corresponding to the likelihood that the control unit 21 firstly reads out in addition to a fixed number of error bits, which is a fixed value of the number of error bits input from outside, and a period of measuring the number of bit errors.

Here, the bit error counter 29 performs the accumulation of the number of error bits in only the data that is firstly read by the control unit 21 and RS decoded. More specifically, when the level of the decoding success flag is the H level (decoding success), the bit error counter 29 accumulates the number of corrected bits within the period of measuring the number of bit errors. On the other hand, when the level of the decoding success flag is the L level (decoding failure), the bit error counter 29 accumulates the fixed number of error bits during the period of measuring the number of bit errors. The bit error counter 29 outputs the accumulated number of bits to outside as a number of bit errors, in every period of measuring the number of bit errors.

Here, since the same data is read from the control unit 21 more than once, the bit error counter 29 may accumulate the number of corrected bits of the n-th time, which is the second time or later, as a substitute for the number of corrected bits at the timing when RS decoding is performed on the data read in the first time. In other words, the bit error counter 29 can accumulate the number of error bits using any decoding result obtained in plural times of decoding. Further, there may be a configuration that a selection signal can be input from outside to select which number of corrected bits of which timing of RS decoding is to be accumulated by the bit error counter 29.

As described above, in the error correction unit 15, when all the data stored in the memory for byte interleaving has been successful in RS decoding or when all the data has been failed in RS decoding, decoding of the unit of decoding as a current processing target is stopped. With this configuration, while preventing the decoding performance from being reduced, the operation by the Viterbi decoding unit 23, memory access by the byte interleaver 26, and the operation by the RS decoding unit 25, which require a large amount of power, can be stopped. Thus, the error correction unit 15 can reduce the power consumption, compared to the configuration in which decoding is not stopped in a similar situation.

In other words, according to a related art error correction unit, Viterbi decoding and RS decoding are repeated on same data a certain number of times even under a reception environment in a noisy condition such that RS decoding fails in a row. In such a case, since RS decoding fails in a row, the positive decoding probability of subsequent Viterbi decoding is not improved and, as a result, Viterbi decoding and RS decoding are kept performed without improving the performance and this causes a larger power consumption. Further, according to the related art error correction unit, Viterbi decoding and RS decoding are repeated on the same data a certain number of times even under a reception environment with few noise such that RS decoding succeeds in a row. In such a case, even when Viterbi decoding succeeds since RS decoding succeeds in a row, Viterbi decoding and RS decoding are repeated and this causes a larger power consumption.

On the other hand, with the error correction unit 15, when RS decoding succeeds or fails in a row, execution of subsequent Viterbi decoding and RS decoding can be stopped, and this can reduce the power consumption. In this case, since the positive decoding probability of Viterbi decoding is not improved even when subsequent Viterbi decoding and RS decoding are not stopped, the stopping of those decoding does not deteriorate the performance of the error correction unit 15.

[Configuration Example of Likelihood Converting Unit]

Figure 3:
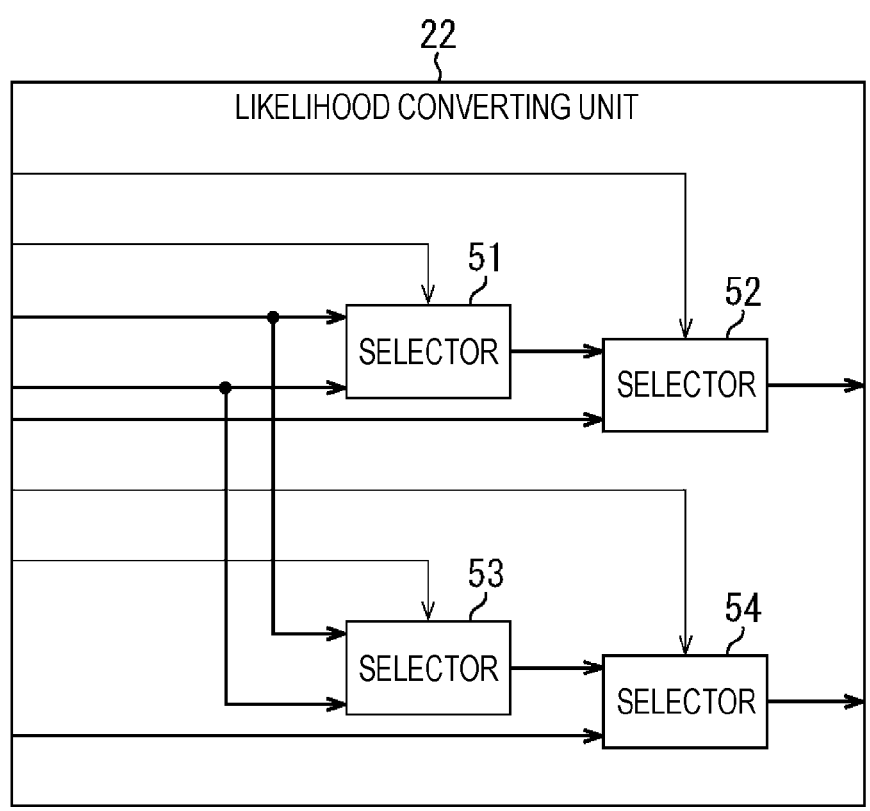
FIG. 3 is a block diagram illustrating a configuration example of a likelihood converting unit of FIG. 2.

FIG. 3 is a block diagram illustrating a configuration example of the likelihood converting unit 22 of FIG. 2.

The likelihood converting unit 22 of FIG. 3 includes selectors 51 to 54.

The selector 51 of the likelihood converting unit 22 selects a likelihood that is closest to 1 or a likelihood that is closest to zero input from outside on the basis of an encoding bit #1 provided from convolutional encoding unit 27 of FIG. 2. Specifically, the selector 51 selects the likelihood that is closest to 1 when the encoding bit #1 is 1 and selects the likelihood that is closest to 0 when the encoding bit #1 is 0. The selector 51 provides the selected likelihood to the selector 52.

The selector 52 selects the likelihood provided from the selector 51 or the likelihood provided from the control unit 21 on the basis of reliability information #1 provided from the convolutional encoding unit 27. Specifically, the selector 52 selects the likelihood provided from the selector 51 when the level of the reliability information #1 is the H level and selects the likelihood provided from the control unit 21 when the level of the reliability information #1 is the L level. The selector 52 provides the selected likelihood to the Viterbi decoding unit 23 of FIG. 2 as a converted likelihood.

Similarly to the selector 51, the selector 53 selects a likelihood that is closest to 1 or a likelihood that is closest to 0 input from outside on the basis of an encoding bit #2 provided from the convolutional encoding unit 27. The selector 53 provides the selected likelihood to the selector 54.

Similarly to the selector 52, the selector 54 selects the likelihood provided from the selector 53 or the likelihood provided from the control unit 21 on the basis of the reliability information #2 provided from the convolutional encoding unit 27. The selector 54 provides the selected likelihood to the Viterbi decoding unit 23 as a converted likelihood.

[Configuration Example of Convolutional Encoding Unit]

Figure 4:
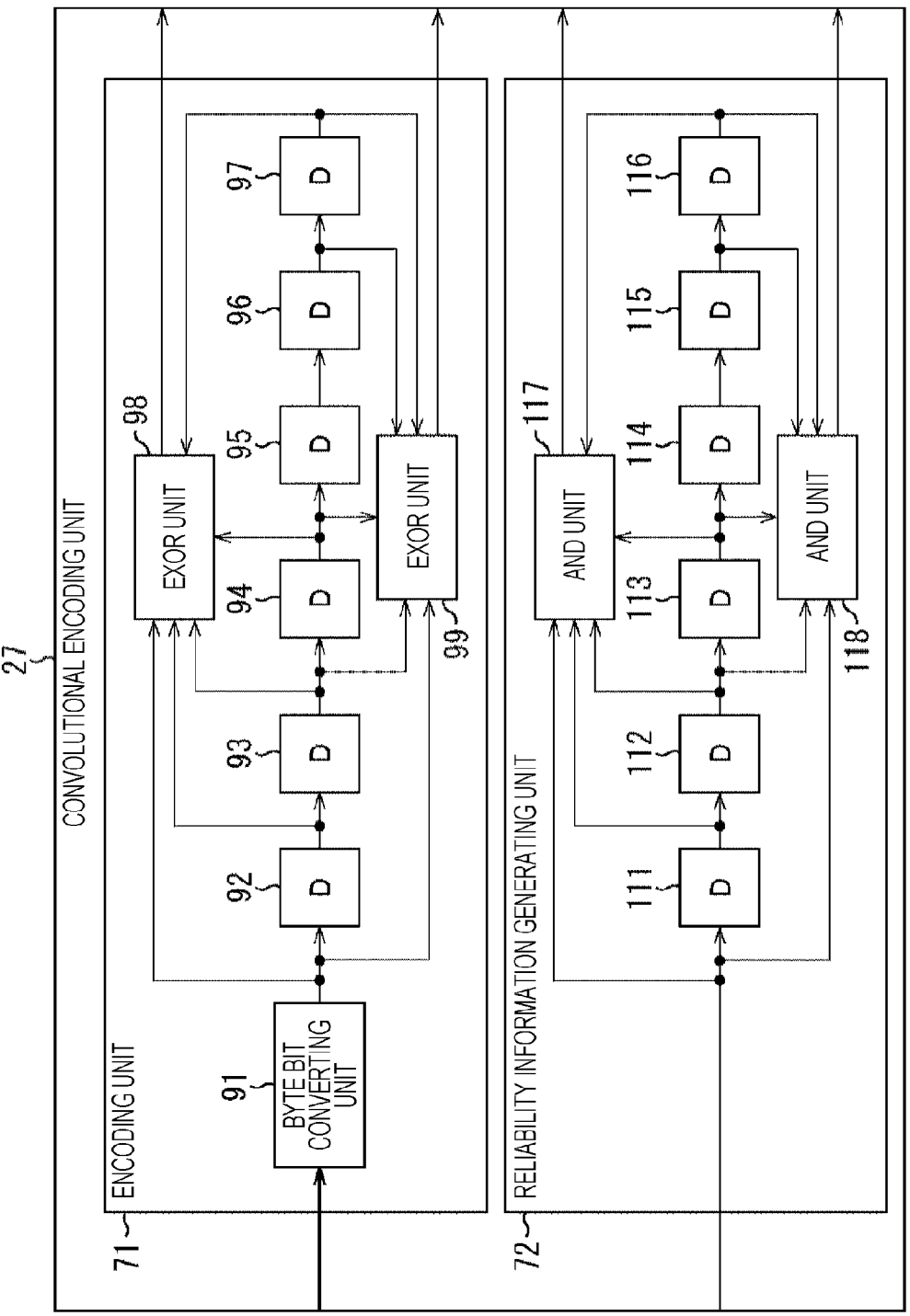
FIG. 4 is a block diagram illustrating a configuration example of a convolutional encoding unit of FIG. 2.

FIG. 4 is a block diagram illustrating a configuration example of the convolutional encoding unit 27 of FIG. 2.

The convolutional encoding unit 27 of FIG. 4 includes an encoding unit 71 and a reliability information generating unit 72.

The encoding unit 71 includes a byte bit converting unit 91, delay units 92 to 97, an EXOR unit 98, and an EXOR unit 99.

The byte bit converting unit 91 of the encoding unit 71 converts interleaved bytewise decoded data provided from the byte interleaver 26 of FIG. 2 into bitwise data and provides bitwise decoded data to the delay unit 92, EXOR unit 98, and EXOR unit 99.

When the bitwise decoded data is input from the byte bit converting unit 91, the delay unit 92 provides maintained decoded data to the delay unit 93 and EXOR unit 98 and maintains the input decoded data. When the bitwise decoded data is input from the delay unit 92, the delay unit 93 provides maintained decoded data to the delay unit 94, EXOR unit 98, and EXOR unit 99 and maintains the input decoded data.

When the bitwise decoded data is input from the delay unit 93, the delay unit 94 provides maintained decoded data to the delay unit 95, EXOR unit 98, and EXOR unit 99 and maintains the input decoded data. When the bitwise decoded data is input from the delay unit 94, the delay unit 95 provides maintained decoded data to the delay unit 96 and maintains the input decoded data.

When the bitwise decoded data is input from the delay unit 95, the delay unit 96 provides maintained decoded data to the delay unit 97 and EXOR unit 99 and maintains the input decoded data. When the bitwise decoded data is input from the delay unit 96, the delay unit 97 provides maintained decoded data to the EXOR unit 98 and EXOR unit 99 and maintains the input decoded data.

The EXOR unit 98 computes exclusive OR of the bitwise decoded data provided from the byte bit converting unit 91, delay units 92 to 94, and delay unit 97, and provides the computation result to the likelihood converting unit 22 of FIG. 2 as an encoding bit #1.

The EXOR unit 99 computes exclusive OR of the bitwise decoded data provided from the byte bit converting unit 91, delay unit 93, delay unit 94, delay unit 96, and delay unit 97, and provides the computation result to the likelihood converting unit 22 as an encoding bit #2.

The reliability information generating unit 72 includes delay units 111 to 116, an AND unit 117, and an AND unit 118.

When the decoding success flag is input from the byte interleaver 26, the delay unit 111 provides maintained decoding success flag to the delay unit 112 and AND unit 117 and maintains the input decoding success flag. When the decoding success flag is input from the delay unit 111, the delay unit 112 provides maintained decoding success flag to the delay unit 113, AND unit 117, and AND unit 118 and maintains the input decoding success flag.

When the decoding success flag is input from the delay unit 112, the delay unit 113 provides maintained decoding success flag to the delay unit 114, AND unit 117, and AND unit 118 and maintains the input decoding success flag. When the decoding success flag is input from the delay unit 113, the delay unit 114 provides maintained decoding success flag to the delay unit 115 and maintains the input decoding success flag.

When the decoding success flag is input from the delay unit 114, the delay unit 115 provides maintained decoding success flag to the delay unit 116 and AND unit 118 and maintains the input decoding success flag. When the decoding success flag is input from the delay unit 115, the delay unit 116 provides maintained decoding success flag to the AND unit 117 and AND unit 118 and maintains the input decoding success flag.

The AND unit 117 computes a logical sum of the decoding success flag provided from the byte interleaver 26, decoding success flags provided from the delay units 111 to 113, and decoding success flag provided from the delay unit 116, and provides the computation result to the likelihood converting unit 22 as the reliability information #1.

The AND unit 118 computes a logical sum of the decoding success flag provided from the byte interleaver 26 as well as the decoding success flags provided from the delay unit 112, delay unit 113, delay unit 115, and delay unit 116, and provides the computation result to the likelihood converting unit 22 as the reliability information #2.

[Description of Process in Error Correcting Unit of FIG. 2]

Figure 5:
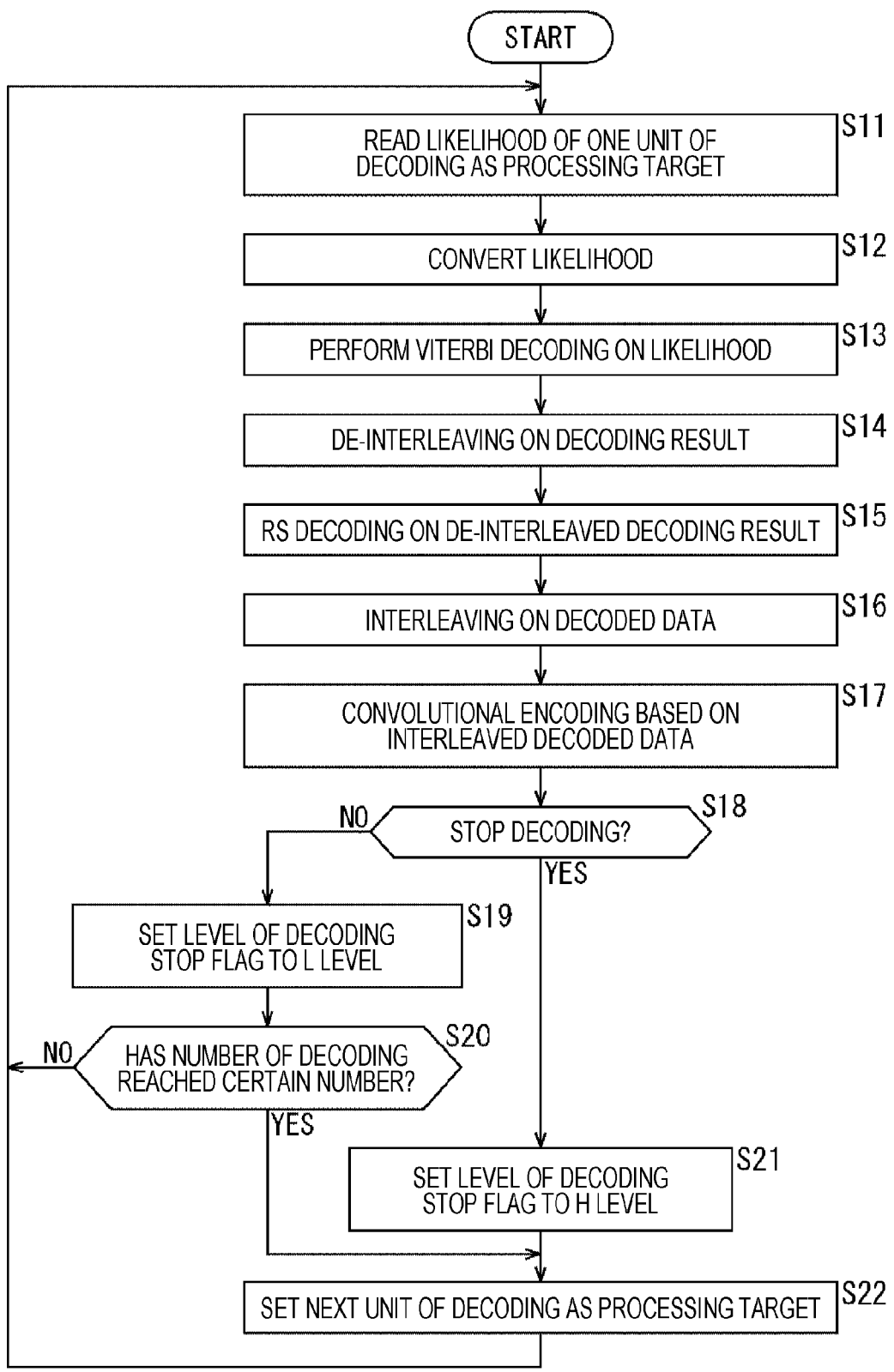
FIG. 5 is a flowchart for explaining an error correction process of the error correction unit of FIG. 2.

FIG. 5 is a flowchart illustrating an error correction process in the error correction unit 15 of FIG. 2. The error correction process starts, for example, whenever a likelihood of an amount of one packet is input from the demodulation unit 14 of FIG. 1 and stored in the control unit 21.

In step S11, the control unit 21 reads a likelihood of one unit of decoding as a processing target among the likelihoods stored in the internal memory and provides the read likelihood to the likelihood converting unit 22.

In step S12, as described above with reference to FIG. 3, the likelihood converting unit 22 performs a likelihood converting process for converting a likelihood on the basis of the likelihood provided from the control unit 21 and the reliability information and encoding bit provided from the convolutional encoding unit 27.

In step S13, the Viterbi decoding unit 23 performs Viterbi decoding on the likelihood provided from the likelihood converting unit 22 and provides the bitwise decoding result to the byte de-interleaver 24.

In step S14, the byte de-interleaver 24 converts the bitwise decoding result provided from the Viterbi decoding unit 23 into a bytewise decoding result and provides de-interleaved bytewise decoding result to the RS decoding unit 25.

In step S15, the RS decoding unit 25 performs RS decoding on the de-interleaved bytewise decoding result provided from the byte de-interleaver 24 and outputs and provides the decoded data obtained as a result to the byte interleaver 26. Further, the RS decoding unit 25 provides a decoding success flag obtained as a result of RS decoding to the byte interleaver 26, decode stop determination unit 28, and bit error counter 29 and provides a number of corrected bits obtained as a result of RS decoding to the bit error counter 29.

In step S16, the byte interleaver 26 performs bytewise interleaving on the decoded data and decoding success flag by associating the decoding success flag provided from the RS decoding unit 25 with decoded data. The byte interleaver 26 provides the interleaved bytewise decoded data and decoding success flag to the convolutional encoding unit 27.

In step S17, when first reading of a likelihood from the control unit 21 is performed, the convolutional encoding unit 27 provides a predetermined value as an encoding bit and reliability information in the L level to the likelihood converting unit 22. Or, when second or subsequent reading of the likelihood from the control unit 21 is performed, the convolutional encoding unit 27 performs convolutional coding by generating an encoding bit on the basis of the bytewise decoded data provided from the byte interleaver 26. Further, the convolutional encoding unit 27 generates reliability information on the basis of the decoding success flag. Then, the convolutional encoding unit 27 provides the encoding bit and reliability information to the likelihood converting unit 22.

In step S18, the decode stop determination unit 28 determines whether or not to stop decoding on the likelihood in one unit of decoding as a processing target, on the basis of the decoding success flag provided from the RS decoding unit 25. For example, as described above, when all the data stored in the memory for byte interleaving is successful in RS decoding or when all the data is failed in RS decoding, the decode stop determination unit 28 determines to stop decoding.

In step S18, when the decode stop determination unit 28 determines not to stop decoding on the likelihood in one unit of decoding as a processing target, the process proceeds to step S19. In step S19, the decode stop determination unit 28 sets the level of the decoding stop flag to be provided to the control unit 21 and byte interleaver 26 to the L level, which indicates that decoding is not stopped.

In step S20, regarding the likelihood in one unit of decoding as a processing target, the control unit 21 determines whether the number of decoding on the likelihood has reached a specified number.

In step S20, when the control unit 21 determines that the number of decoding has not reached the specified number, the process returns to step S11. Then, the control unit 21 reads the likelihood of the same unit of decoding as a processing target and, subsequently, the process similar to the above described process is repeated.

On the other hand, in step S18, when the decode stop determination unit 28 determines to stop decoding on the likelihood in one unit of decoding as a processing target, the process proceeds to step S21. In step S21, the decode stop determination unit 28 sets the level of the decoding stop flag provided to the control unit 21 and byte interleaver 26 to the H level, which indicates that the decoding is stopped.

When it is determined in step S20 that the number of decoding has reached the specified number or after the process of step S21, the process proceeds to step S22. In other words, in this case, decoding on the likelihood in one unit of decoding as the current processing target is ended.

In step S22, the control unit 21 sets a next unit of decoding as a processing target, and the process returns to step S11. Thus, in this case, the control unit 21 reads the likelihood in one unit of decoding as a newly set processing target and, subsequently, the process similar to the above described process is repeated.

As described above, when all the data stored in the memory for byte interleaving is successful or failed in RS decoding, the error correction unit 15 can stop decoding on one unit of decoding as a processing target. Thus, the error correction unit 15 can prevent the decoding performance from being deteriorated and reduce the power consumption.

[First Modification Example of First Configuration Example of Error Correction Unit]

Figure 6:
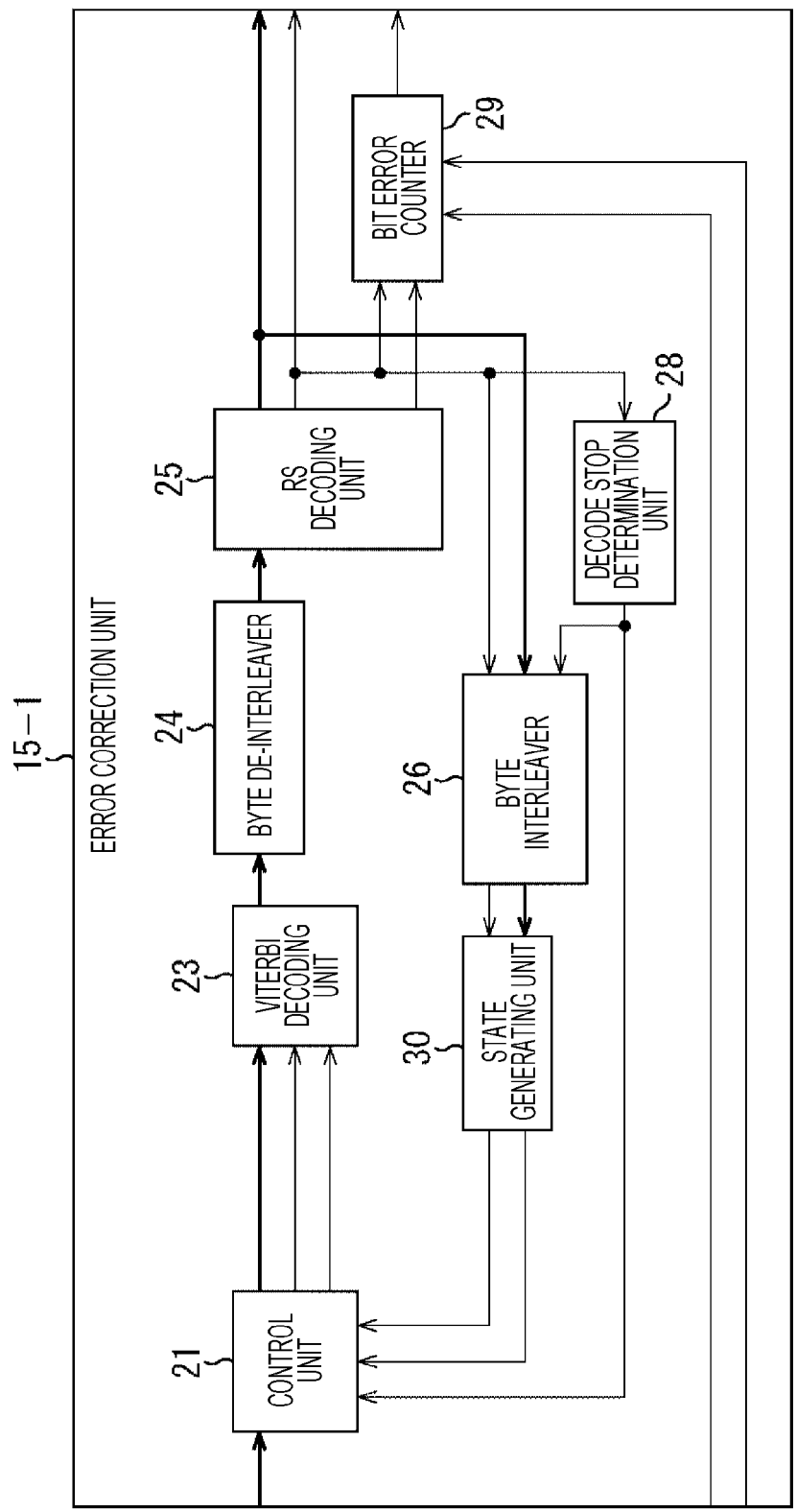
FIG. 6 is a block diagram illustrating a first modification example of the first configuration example of the error correction unit of FIG. 1.

Next, FIG. 6 is a block diagram illustrating a first modification example of the first configuration example (FIG. 2) of the error correction unit 15 of FIG. 1. Here, for the blocks composing an error correction unit 15-1 illustrated FIG. 6, the same reference numerals are applied to the blocks common with those in the error correction unit 15 illustrated in FIG. 2 and the detailed explanation thereof will be omitted.

In other words, the error correction unit 15-1 includes the control unit 21, Viterbi decoding unit 23, byte de-interleaver 24, RS decoding unit 25, byte interleaver 26, decode stop determination unit 28, and bit error counter 29, which are common with those in the error correction unit 15 of FIG. 2. Here, the error correction unit 15-1 is different from the error correction unit 15 of FIG. 2 in that a state generating unit 30 is included as a substitute for the likelihood converting unit 22 and convolutional encoding unit 27 of FIG. 2.

The error correction unit 15-1 of FIG. 6 performs a termination process of Viterbi decoding on the basis of the decoding result that has passed through the byte de-interleaver 24.

Specifically, similarly to the control unit 21 of FIG. 2, the control unit 21 has an internally mounted memory and temporarily stores the likelihood provided from the demodulation unit 14 of FIG. 1. Then, similarly to the control unit 21 of FIG. 2, the control unit 21 performs first reading of likelihood and provides the read likelihood to the Viterbi decoding unit 23. In this case, the control unit 21 provides a predetermined value as a state and reliability information of the state in the L level to the Viterbi decoding unit 23. Further, when the reliability information of the state and the state are output from the state generating unit 30, the control unit 21 performs second reading of a predetermined unit of the likelihood and provides the read likelihood to the Viterbi decoding unit 23.

The Viterbi decoding unit 23 performs Viterbi decoding on the likelihood provided from the control unit 21 on the basis of the state and reliability information of the state provided from the control unit 21.

Here, Viterbi decoding will be described. In Viterbi decoding, firstly, for each state at the current time and a state at the immediately preceding time, a state metric of the state at the current time is calculated, from a branch metric of branches in a trellis calculated from the likelihood and a state metric of the state at the immediately preceding time. Then, a path (branch) between the state at the immediately preceding time and the state at the current time when a sum of the state metric of the state at the immediately preceding time and the branch metric becomes minimum is set as a survival path. Then, when a process called Traceback that traces the survival path from a certain time is performed, a bitstream (a code bit or an information bit) assigned to the path (branch) is obtained as the decoding result. In Viterbi decoding, for example, a decoding process is not immediately started, but the decoding process starts when the path merges with an optimal path (maximum likelihood path) after training for a predetermined period.

As described above, the Viterbi decoding unit 23 performs such Viterbi decoding on the basis of the state and the reliability information of the state provided from the control unit 21. Specifically, when the level of the reliability information of the state is the H level, the Viterbi decoding unit 23 performs a termination process of Viterbi decoding such that the state metric of the state provided from the control unit 21 is set to a minimum value and a state metric of another state is set to a maximum value. Then, the Viterbi decoding unit 23 determines the survival path on the basis of the likelihood and the state metric after the termination process, and obtains the bitwise decoding result by performing Traceback using the state provided from the control unit 21 as a start state of Traceback.

In this manner, when the level of the reliability information of the state is the H level, since the Viterbi decoding unit 23 sets the start state of Traceback as the state provided from the control unit 21, it is possible to start Traceback from a state having a minimum state metric without providing a circuit to compare the state metrics. By starting Traceback from the state having the minimum state metric, the state is highly likely to be along the optimal path from the start time of Traceback.

On the other hand, when the level of the reliability information of the state is the L level, the Viterbi decoding unit 23 performs normal Viterbi decoding on the likelihood and obtains the bitwise decoding result. The Viterbi decoding unit 23 provides the bitwise decoding result to the byte de-interleaver 24.

The state generating unit 30 generates the state and the reliability information of the state on the basis of the bytewise decoded data and decoding success flag provided from the byte interleaver 26. Then, the state generating unit 30 provides the state and the reliability information of the state to the control unit 21.

In this manner, in the error correction unit 15-1, the state generating unit 30 generates a state and reliability information of the state on the basis of the bytewise decoded data and decoding success flag provided from the byte interleaver 26 and provides the state and reliability information of the state to the control unit 21.

With this configuration, the error correction unit 15-1 can improve the decoding error performance and reduce the power consumption, similarly to the error correction unit 15 of FIG. 2. In other words, when all the data stored in the memory for byte interleaving is successful or failed in RS decoding, since decoding on one unit of decoding as a current processing target is stopped, the power consumption can be suppressed while preventing the decoding performance from being deteriorated.

[Configuration Example of State Generating Unit]

Figure 7:
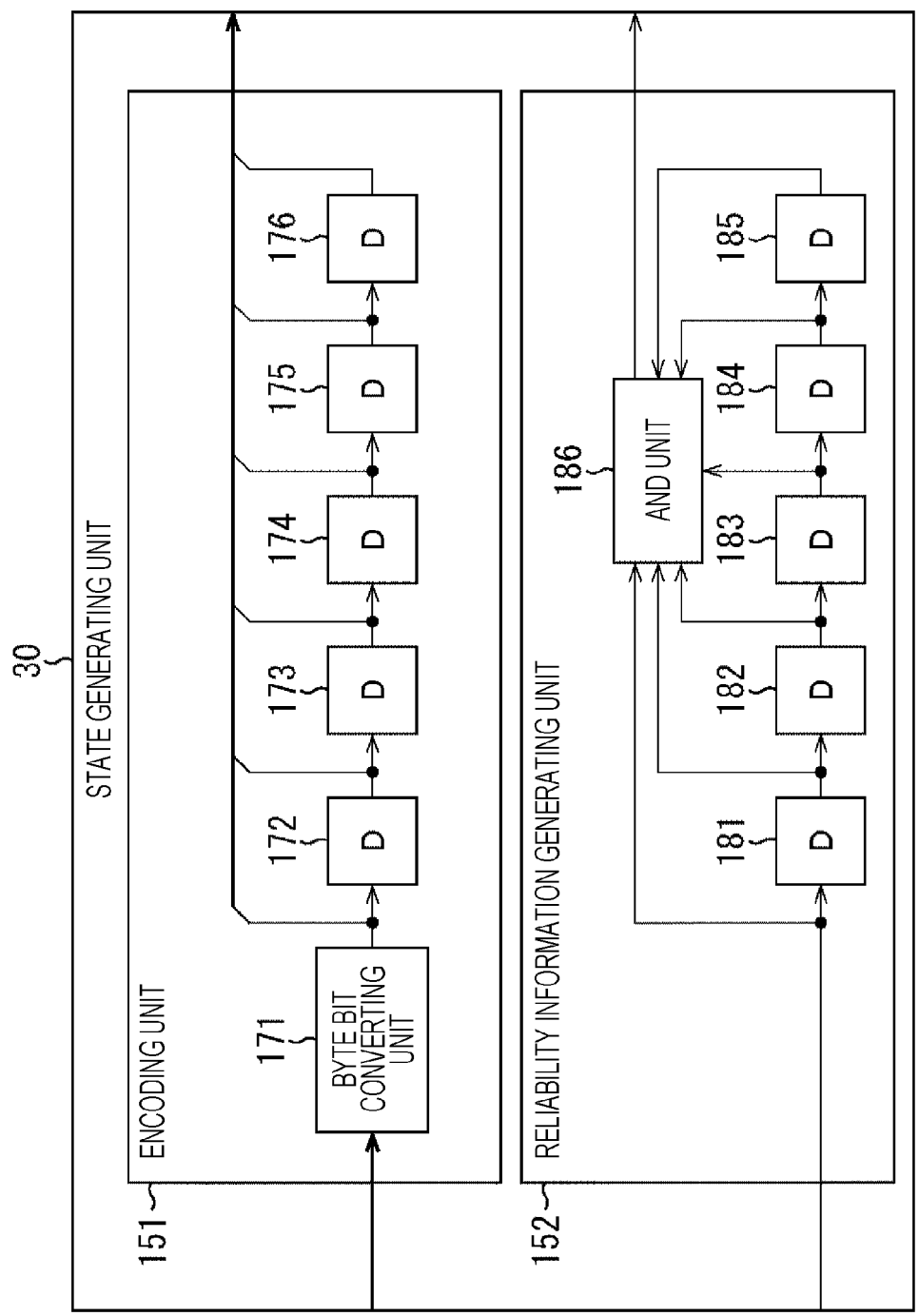
FIG. 7 is a block diagram illustrating a configuration example of a state generating unit of FIG. 6.

FIG. 7 is a block diagram illustrating a configuration example of the state generating unit 30 of FIG. 6.

The state generating unit 30 of FIG. 7 includes an encoding unit 151 and a reliability information generating unit 152.

The encoding unit 151 of the state generating unit 30 includes a byte bit converting unit 171 and delay units 172 to 176.

The byte bit converting unit 171 converts bytewise decoded data provided from the byte interleaver 26 of FIG. 6 into bitwise decoded data, provides the result to the control unit 21 as a state in one bit, and also provides the result to the delay unit 172.

The delay units 172 to 176 are sequentially connected in series. When bitwise decoded data is input from the byte bit converting unit 171, the delay unit 172 provides maintained decoded data to the control unit 21 as the state in one bit and also provides the data to the delay unit 173. Then, the delay unit 172 maintains the input bitwise decoded data.

Similarly to the delay unit 172, when bitwise decoded data is input from the delay unit in an earlier stage, the delay units 173 to 176 provide maintained decoded data to the control unit 21 as the state in one bit and also provide the data to the delay unit in a later stage. Then, similarly to the delay unit 172, the delay units 173 to 176 maintain the input bitwise decoded data.

Accordingly, the encoding unit 151 provides decoded data of six bits to the control unit 21 as states.

The reliability information generating unit 152 includes delay units 181 to 185 and an AND unit 186.

The delay units 181 to 185 are sequentially connected in series. When a decoding success flag is input from the byte interleaver 26 of FIG. 6, the delay unit 181 provides a maintained decoding success flag to the AND unit 186 and delay unit 182. Then, the delay unit 181 maintains the input decoding success flag.

Similarly to the delay unit 181, when a decoding success flag is input from the delay unit in an earlier stage, the delay units 182 to 185 provide a maintained decoding success flag to the AND unit 186 and delay unit in a later stage. Then, similarly to the delay unit 181, the delay units 182 to 185 maintain the input decoding success flag.

The AND unit 186 computes a logical sum of the decoding success flags provided from the byte interleaver 26 and the delay units 181 to 185 and provides the logical sum obtained as a result to the control unit 21 as the reliability information of the state.

[Second Modification Example of First Configuration Example of Error Correction Unit]

Figure 8:
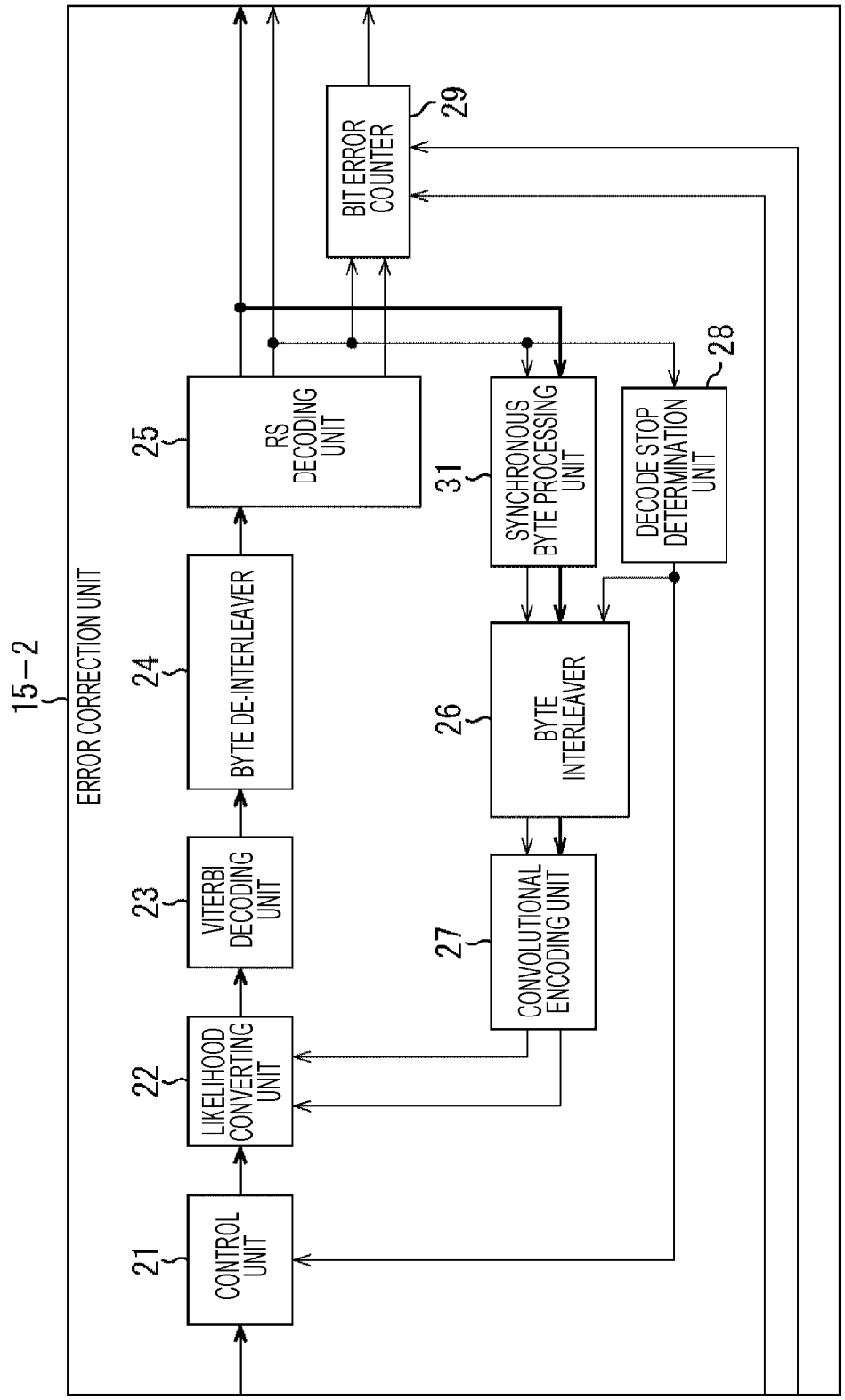
FIG. 8 is a block diagram illustrating a second modification example of the first configuration example of the error correction unit of FIG. 1.

Next, FIG. 8 is a block diagram illustrating a second modification example of the first configuration example (FIG. 2) of the error correction unit 15 in FIG. 1. Here, among the blocks composing the error correction unit 15-2 illustrated in FIG. 8, same reference numerals are applied to the blocks common with those in the error correction unit 15 illustrated in FIG. 2 and the detailed explanation thereof will be omitted.

In other words, the error correction unit 15-2 has the common configuration with the error correction unit 15 of FIG. 2 in that the control unit 21, likelihood converting unit 22, Viterbi decoding unit 23, byte de-interleaver 24, RS decoding unit 25, byte interleaver 26, convolutional encoding unit 27, decode stop determination unit 28, and bit error counter 29 are included. Here, the error correction unit 15-1 is different from the error correction unit 15 of FIG. 2 in that a synchronous byte processing unit 31 is included.

The synchronous byte processing unit 31 serves as a replacement unit, and, to the synchronous byte processing unit 31, decoded data and a decoding success flag are provided from the RS decoding unit 25. Then, the synchronous byte processing unit 31 replaces a value of a synchronous byte of bytewise decoded data output from the RS decoding unit 25 with a predetermined value.

Specifically, in the DVB-T standard, a value of a synchronous byte of a packet is a known value 0x47 or 0xb8. The value is 0xb8 once in eight packets and the other values are 0x47. Here, when the decoding success flag is H (decoding success) and 0xb8 is input to the synchronous byte of a packet, this condition is referred to as that a b8 synchronous condition has started. Then, in the b8 synchronous condition, although it is needed to obtain a header of a packet input to the Viterbi decoding unit 23 from the synchronous byte of a packet after byte de-interleaving, the synchronous byte processing unit 31 can replace the synchronous byte with 0x47 or 0xb8 as assuming that an eleven-packet delay occurs between the byte interleaver 26 and byte de-interleaver 24. Here, when it is not in the b8 synchronous condition, the replacement of the synchronous byte of the packet is not performed.

Further, in the ISDB-T standard, the synchronous byte of the packet is fixed to 0x47; however, at the timing of inputting by the Viterbi decoding unit 23 (after RS coding in the view of the transmitting side), 0x47 is set in the end of the packet. Accordingly, regardless of the decoding success flag, the synchronous byte processing unit 31 replaces the byte in the end of the packet with 0x47 and outputs data processed in the synchronous byte process as described above.

Further, when a DVB-T standard signal is received, the synchronous byte processing unit 31 outputs the synchronous byte part as H of an output decoding success flag if it is in the b8 synchronous condition and outputs the synchronous byte part as an input decoding success flag if it is not in the b8 synchronous condition. Further, when an ISDB-T standard signal is received, the synchronous byte processing unit 31 outputs H as the output decoding success flag, regardless of the input decoding success flag.

Then, the synchronous byte processing unit 31 provides the replaced bytewise decoded data and decoding success flag to the byte interleaver 26.

Since the error correction unit 15-2 having the above described configuration includes the synchronous byte processing unit 31, the performance is improved by the synchronous byte process and, similarly to the error correction unit 15 of FIG. 2, the power consumption can be reduced. In other words, when all the data stored in the memory for byte interleaving is successful or failed in RS decoding, the power consumption can be suppressed by stopping decoding on one unit of decoding as the current processing target, while preventing the decoding performance from being deteriorated.

Here, there may be a configuration that the synchronous byte processing unit 31 of the error correction unit 15-2 is included in the error correction unit 15 of FIG. 2 or included in the error correction unit 15-1 of FIG. 6 for example. Further, there may be a configuration that the state generating unit 30 of the error correction unit 15-1 of FIG. 6 is included in the error correction unit 15 of FIG. 2 or included in the error correction unit 15-2 of FIG. 8 for example.

[Second Configuration Example of Error Correction Unit]

Figure 9:
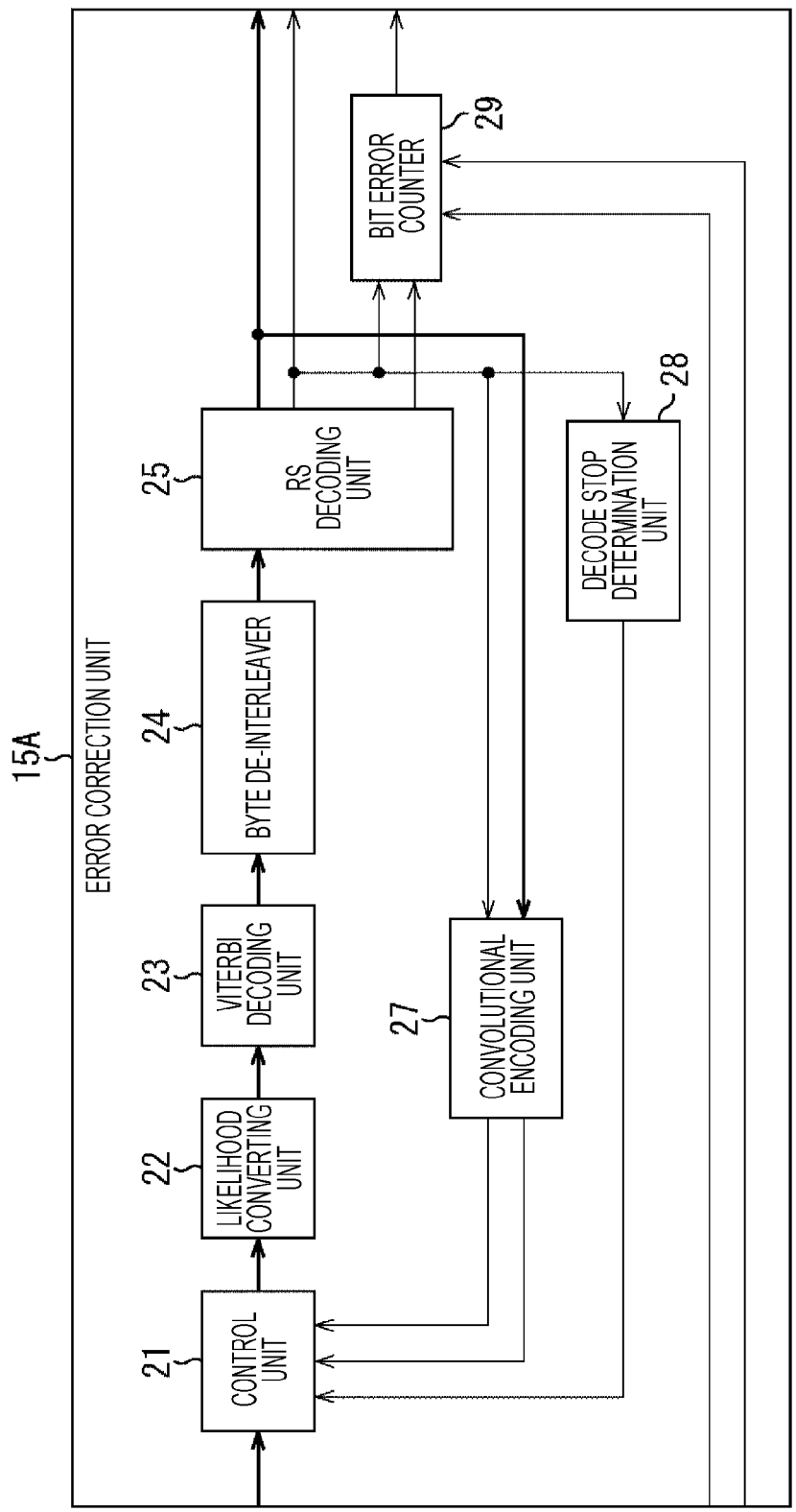
FIG. 9 is a block diagram illustrating a second configuration example of the error correction unit of FIG. 1.

FIG. 9 is a block diagram illustrating a second configuration example of the error correction unit 15 of FIG. 1. Here, among the blocks composing the error correction unit 15A of FIG. 9, same reference numerals are applied to the blocks common with those in the error correction unit 15 of FIG. 2 and the detailed explanation thereof will be omitted.

In other words, the error correction unit 15A is common with the error correction unit 15 of FIG. 2 in that the control unit 21, likelihood converting unit 22, Viterbi decoding unit 23, byte de-interleaver 24, RS decoding unit 25, convolutional encoding unit 27, decode stop determination unit 28, and bit error counter 29 are included. Here, the error correction unit 15A is different from the error correction unit 15 of FIG. 2 in that the byte interleaver 26 of FIG. 2 is not included.

In the error correction unit 15A, the control unit 21 has an internally mounted memory and stores an input likelihood. Then, the control unit 21 performs reading of a same likelihood from the memory once or twice. The decode stop determination unit 28 determines whether the control unit 21 is to perform second reading of the same likelihood from the memory according to the decoding stop flag which is generated on the basis of the information obtained from the decoding result of the Viterbi decoding and RS decoding of the likelihood read in the first time. In other words, the control unit 21 performs the second reading of the same likelihood when the level of the decoding stop flag is the L level and does not perform the second reading of the same likelihood when the level of the decoding stop flag is the H level. Then, the control unit 21 provides the encoding bit and its reliability information to the likelihood converting unit 22 in addition to the likelihood read from the memory.

For example, when an amount of a certain unit (for example, in case of the ISDB-T and DVB-T, an amount of one packet (=an amount of one RS code word)) is stored, the first reading of the likelihood is performed for each unit. In the control unit 21, in that case, an encoding bit output at the same time may be arbitrary and the reliability information of the encoding bit is set as the L level, which indicates that it is not reliable, for example.

Further, in the control unit 21, when the second reading of the likelihood is performed, the start timing of reading is the timing when the reliability information and encoding bit generated, in the convolutional encoding unit 27, using the decoded data and decoding success flag from the RS decoding unit 25 are input to the control unit 21. In this case, when the input encoding bit and its reliability information are what is generated using the decoded data and decoding success flag that have passed through a zero delay branch in the byte de-interleaver 24, the control unit 21 outputs the input encoding bit and its reliability information. On the other hand, when the input encoding bit and its reliability information are not what is generated using the decoded data and decoding success flag that have passed through a zero delay branch in the byte de-interleaver 24, in the control unit 21, the encoding bit may be arbitrary and the reliability information of the encoding bit is set as the L level, which indicates that it is not reliable for example.

The byte de-interleaver 24 always performs de-interleaving for first decoding. On the other hand, for second decoding, the byte de-interleaver 24 performs updating only when RS decoding succeeds in the first decoding and does not perform updating for the second decoding when RS decoding fails in the first decoding.

The RS decoding unit 25 performs RS decoding only on the input data of the first decoding. Then, only when the decoding result of the first decoding is successful, the RS decoding unit 25 outputs the decoded data as an output of the error correction unit 15A and inputs the data that has passed through the zero delay branch in the byte de-interleaver 24 to the convolutional encoding unit 27.

On the basis of the decoding success flag provided from the RS decoding unit 25, the decode stop determination unit 28 generates a decoding stop flag, which indicates whether to stop decoding and provides the decoding stop flag to the control unit 21. For example, when the decoding success flag is the H level indicating a decoding success, the decode stop determination unit 28 outputs a decoding stop flag of the L level, which indicates that decoding is not stopped. On the other hand, when the decoding success flag is the L level indicating a decoding failure, the decode stop determination unit 28 outputs a decoding stop flag of the H level, which indicates that decoding is stopped.

The error correction unit 15A having the above configuration can suppress the memory capacity and suppress the power consumption while maintaining the performance improvement obtained by repeating decoding.

[First Modification Example of Second Configuration Example of Error Correction Unit]

Figure 10:
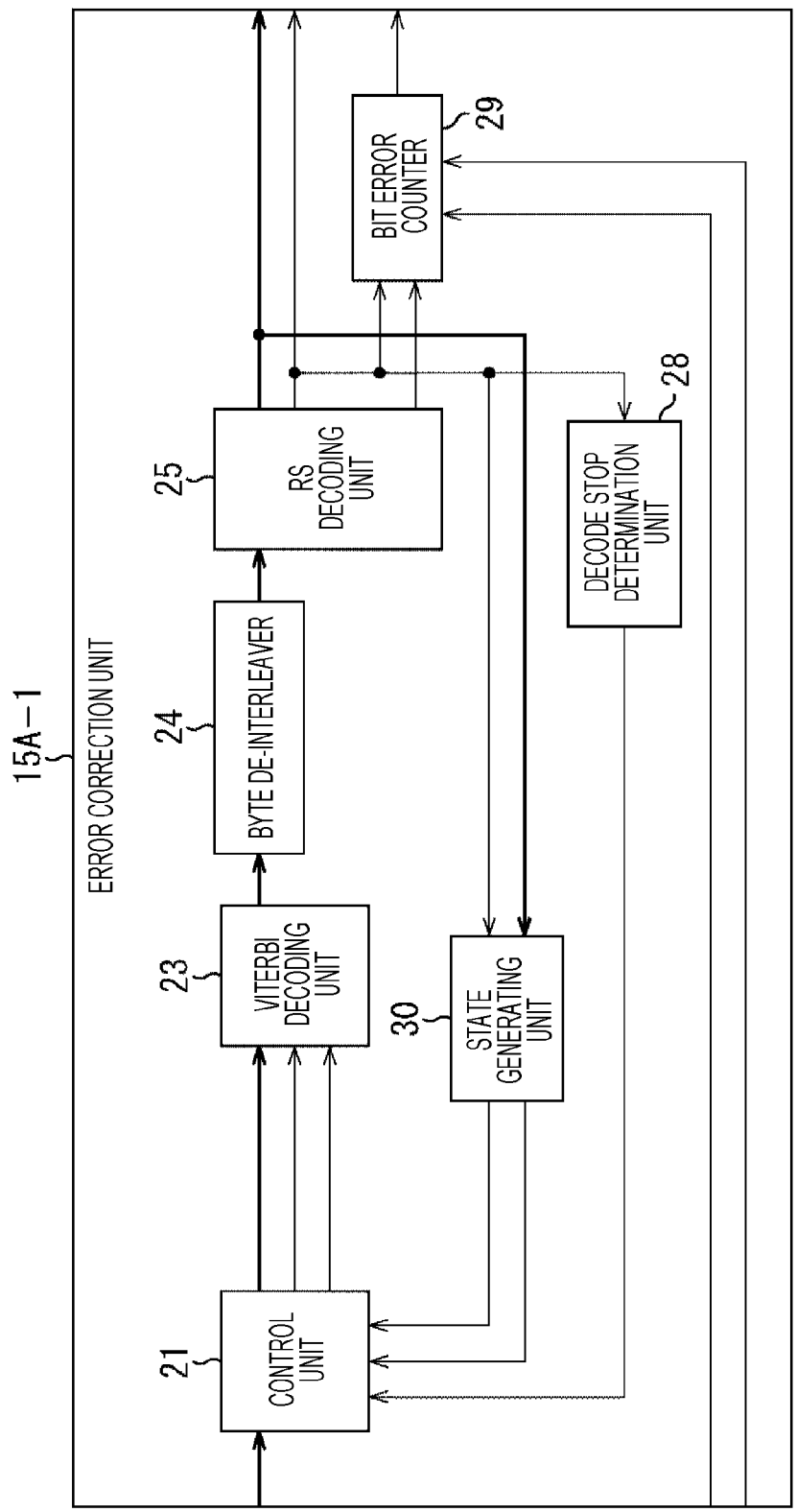
FIG. 10 is a block diagram illustrating a first modification example of the second configuration example of the error correction unit of FIG. 1.

Next, FIG. 10 is a block diagram illustrating a first modification example of the second configuration example (FIG. 9) of the error correction unit 15 of FIG. 1. Here, among the blocks composing the error correction unit 15A-1 of FIG. 10, same reference numerals are applied to the blocks common with those in the error correction unit 15A of FIG. 9 and the detailed explanation thereof will be omitted.

In other words, the error correction unit 15A-1 has a configuration in common with the error correction unit 15A of FIG. 9 in that the control unit 21, Viterbi decoding unit 23, byte de-interleaver 24, RS decoding unit 25, decode stop determination unit 28, and bit error counter 29 are included. Here, the error correction unit 15A-1 is different from the error correction unit 15A of FIG. 9 in that the state generating unit 30 is included as a substitute for the likelihood converting unit 22 and convolutional encoding unit 27 of FIG. 9.

In other words, in the error correction unit 15A-1, the decoded data and decoding success flag output from the RS decoding unit 25 are provided to the state generating unit 30. Then, similarly to the state generating unit 30 of the error correction unit 15-1 illustrated in FIG. 6, the state generating unit 30 generates a state and reliability information of the state on the basis of the bytewise decoded data and decoding success flag provided from the RS decoding unit 25. Then, the state generating unit 30 provides the state and reliability information of the state to the control unit 21.

In the error correction unit 15A-1, the control unit 21 has an internally mounted memory and stores an input likelihood. Then, the control unit 21 performs reading of same likelihood from the memory once or twice. It is determined whether the control unit 21 performs second reading of the same likelihood from the memory according to a decoding stop flag generated in the decode stop determination unit 28 on the basis of information obtained from the decoding results of Viterbi decoding and RS decoding of the likelihood read in the first time. In other words, the control unit 21 performs the second reading of the same likelihood when the level of the decoding stop flag is the L level and does not perform the second reading of the same likelihood when the level of the decoding stop flag is the H level. Then, the control unit 21 provides an encoding bit and its reliability information to the likelihood converting unit 22 in addition to the likelihood read from the memory.

For example, when an amount of a certain unit (for example, in case of the ISDB-T and DVB-T, an amount of one packet (=an amount of one RS code word)) is stored, first reading of the likelihood is performed for each unit. In the control unit 21, in that case, a state output at the same time may be arbitrary and the reliability information of the state is set as the L level, which indicates that it is not reliable, for example.

Further, when the control unit 21 performs the second reading of the likelihood, the timing to start reading is when the reliability information and state, which are generated in the state generating unit 30 using the decoded data and decoding success flag from the RS decoding unit 25, are input to the control unit 21. In this case, when the state and its reliability information provided from the state generating unit 30 are those generated using the decoded data and decoding success flag which have passed through the zero delay branch in the byte de-interleaver 24, the control unit 21 outputs the input state and its reliability information. On the other hand, when the state and its reliability information provided from the state generating unit 30 are not those generated using the decoded data and decoding success flag which have passed through the zero delay branch in the byte de-interleaver 24, the control unit 21 may set the state arbitrarily and the reliability information of the state may be set as the L level, which indicates that it is not reliable, for example.

The error correction unit 15A-1 having the above configuration does not include the likelihood converting unit 22 and convolutional encoding unit 27, which are included in the error correction unit 15A of FIG. 9, but includes the state generating unit 30, and this improves the decoding error performance, compared to the error correction unit 15A of FIG. 9. Further, similarly to the error correction unit 15A of FIG. 9, the error correction unit 15A-1 can reduce the power consumption.

[Second Modification Example of Second Configuration Example of Error Correction Unit]

Figure 11:
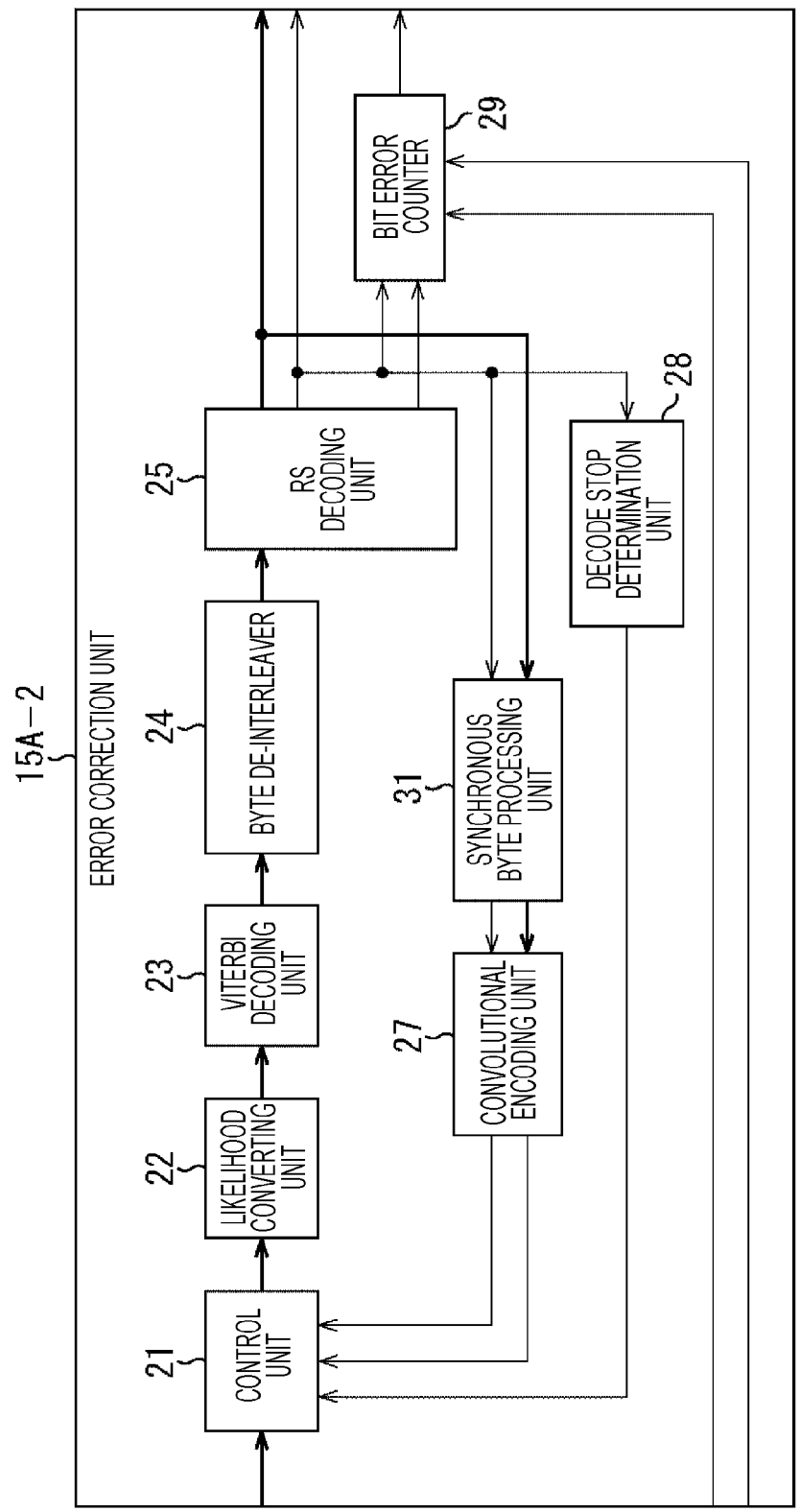
FIG. 11 is a block diagram illustrating a second modification example of the second configuration example of the error correction unit of FIG. 1.

Next, FIG. 11 is a block diagram illustrating a second modification example of the second configuration example (FIG. 9) of the error correction unit 15 in FIG. 1. Here, among the blocks composing the error correction unit 15A-2 illustrated in FIG. 11, same reference numerals are applied to the blocks common with those in the error correction unit 15A of FIG. 9 and the detailed explanation thereof will be omitted.

In other words, the error correction unit 15A-2 has a configuration common with the error correction unit 15A of FIG. 9 in that the control unit 21, likelihood converting unit 22, Viterbi decoding unit 23, byte de-interleaver 24, RS decoding unit 25, convolutional encoding unit 27, decode stop determination unit 28, and bit error counter 29 are included. Here, the error correction unit 15A-2 is different from the error correction unit 15A of FIG. 9 in that the synchronous byte processing unit 31 is included.

In other words, in the error correction unit 15A-2, the decoded data and decoding success flag output from the RS decoding unit 25 are provided to the synchronous byte processing unit 31 and the decoded data and decoding success flag are provided from the synchronous byte processing unit 31 to the convolutional encoding unit 27. In this case, as described above with reference to FIG. 8, the synchronous byte processing unit 31 serves as a replacement unit and replaces the value of the synchronous byte among the bytewise decoded data output from the RS decoding unit 25 into a predetermined value for example.

Thus, since the synchronous byte processing unit 31 is included, the error correction unit 15A-2 can improve the performance compared to the error correction unit 15A of FIG. 9 and can reduce the power consumption similarly to the error correction unit 15A of FIG. 9.

Here, the synchronous byte processing unit 31 included in the error correction unit 15A-2 may have the configuration of the error correction unit 15A-1 of FIG. 10, for example. Further, the state generating unit 30 included in the error correction unit 15A-1 of FIG. 10 may have the configuration of the error correction unit 15A of FIG. 9 or the configuration of the error correction unit 15A-2 of FIG. 11 for example.

[Third Configuration Example of Error Correction Unit]

Figure 12:
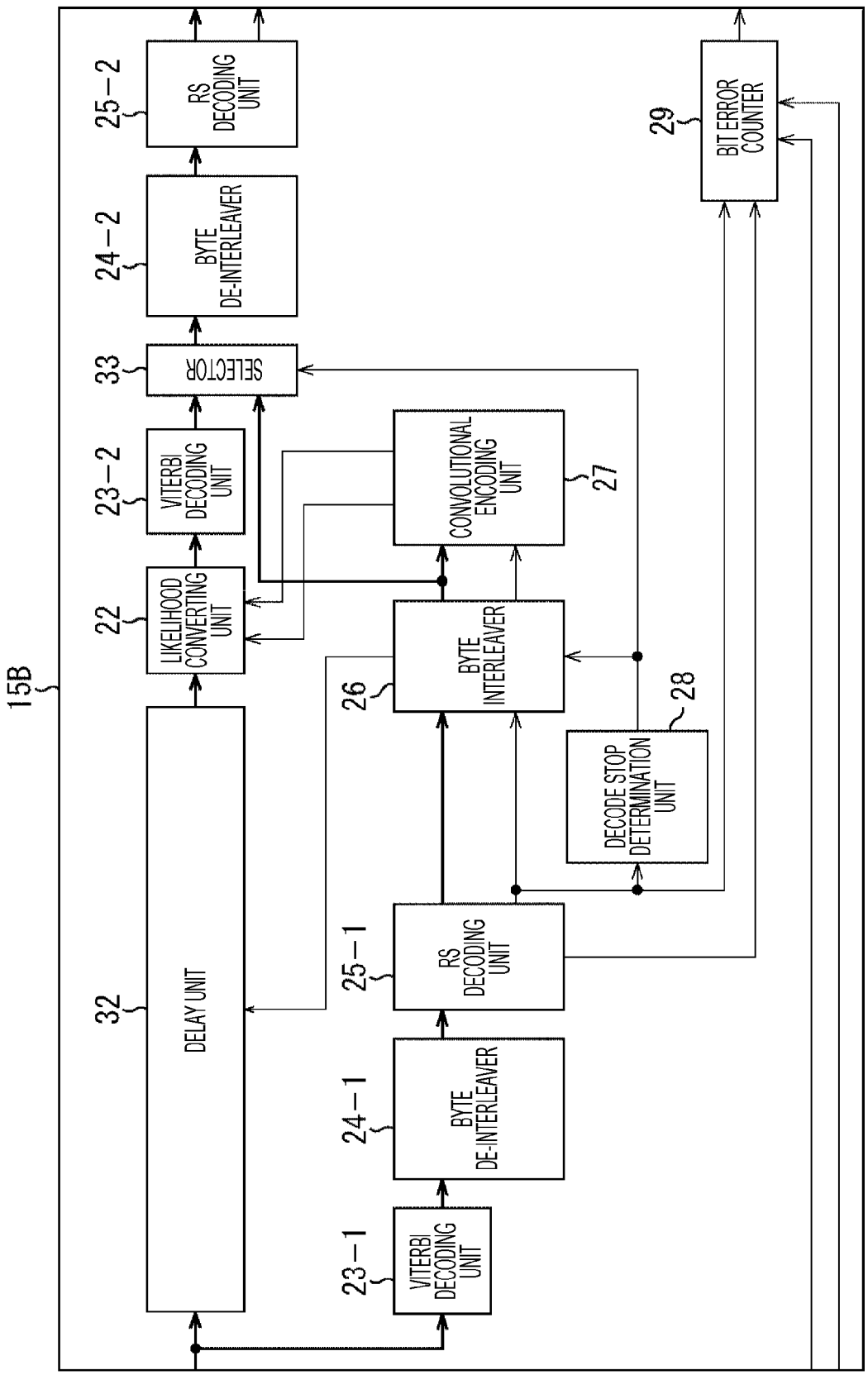
FIG. 12 is a block diagram illustrating a third configuration example of the error correction unit of FIG. 1.

FIG. 12 is a block diagram illustrating a third configuration example of the error correction unit 15 of FIG. 1. Here, among the blocks composing an error correction unit 15B illustrated in FIG. 12, same reference numerals are applied to the blocks common with the error correction unit 15 of FIG. 2 and the detailed explanation will be omitted.

As illustrated in FIG. 12, the error correction unit 15B has a configuration in common with the error correction unit 15 of FIG. 2 in that the likelihood converting unit 22, byte interleaver 26, convolutional encoding unit 27, decode stop determination unit 28, and bit error counter 29 are included. Here, the error correction unit 15B is different from the error correction unit 15 of FIG. 2 in that a couple of the Viterbi decoding units 23, a couple of the byte de-interleavers 24, and a couple of the RS decoding units 25 are included. Further, the error correction unit 15B is different from the error correction unit 15 of FIG. 2 in that the delay unit 32 and selector 33 are included.

To the delay unit 32 and Viterbi decoding unit 23-1 of the error correction unit 15B, a likelihood on which a multi-value demodulation and a demapping process are performed is input bitwise from the demodulation unit 14 of FIG. 1. The Viterbi decoding unit 23-1 performs Viterbi decoding on the provided likelihood and provides the bitwise decoding result to the byte de-interleaver 24-1.

The byte de-interleaver 24-1 converts the bitwise decoding result provided from the Viterbi decoding unit 23-1 into a bytewise decoding result.

The RS decoding unit 25-1 performs RS decoding on the bytewise decoding result, which is de-interleaved by the byte de-interleaver 24-1. The RS decoding unit 25 provides a decoding success flag, which expresses whether the decoded data obtained as a result and decoding is succeeded, to the byte interleaver 26 and decode stop determination unit 28.

To the byte interleaver 26, the decoding success flag is provided together with the decoded data, which is decoded in the RS decoding unit 25-1. The byte interleaver 26 associates the decoding success flag provided from the RS decoding unit 25 with the decoded data, interleaves bytewise, and provides the interleaved bytewise decoded data and decoding success flag to the convolutional encoding unit 27.

Further, to the byte interleaver 26, the decoding stop flag is provided from the decode stop determination unit 28. The byte interleaver 26 generates an output mask flag, which indicates whether or not to output the likelihood from the delay unit 32 to the likelihood converting unit 22, on the basis of the decoding stop flag provided from the decode stop determination unit 28 and provides the output mask flag to the delay unit 32. For example, when the level of the decoding stop flag is the H level, the byte interleaver 26 provides an output mask flag of an H level, which indicates that the likelihood is not transmitted, to the delay unit 32. On the other hand, when the level of the decoding stop flag is the L level, the byte interleaver 26 provides an output mask flag of an L level, which indicates that the likelihood is output, to the delay unit 32.

The convolutional encoding unit 27 performs convolutional coding by generating an encoding bit on the basis of the bytewise decoded data provided from the byte interleaver 26. Further, the convolutional encoding unit 27 generates reliability information on the basis of the decoding success flag. Then, the convolutional encoding unit 27 provides the encoding bit and reliability information to the likelihood converting unit 22.

The delay unit 32 provides the likelihood provided from the demodulation unit 14 of FIG. 1 to the likelihood converting unit 22 on the basis of the output mask flag provided from the byte interleaver 26. For example, when the level of the output mask flag is the L level, the delay unit 32 provides the likelihood corresponding to the encoding bit and reliability information generated in the convolutional encoding unit 27 to the likelihood converting unit 22, at the timing when the encoding bit and reliability information are provided from the convolutional encoding unit 27 to the likelihood converting unit 22. On the other hand, when the level of the output mask flag is the H level, the delay unit 32 does not output the likelihood to the likelihood converting unit 22. Thus, in this case, the operations in the likelihood converting unit 22 and Viterbi decoding unit 23-2 are stopped.

The likelihood converting unit 22 performs likelihood conversion on the basis of the likelihood provided from the delay unit 32 and the encoding bit and reliability information provided from the convolutional encoding unit 27 and provides the converted likelihood to the Viterbi decoding unit 23-2.

The Viterbi decoding unit 23-2 performs Viterbi decoding of the likelihood provided from the likelihood converting unit 22 and provides the bitwise decoding result to the byte de-interleaver 24-2 via the selector 33.

Here, the selector 33 provides, to the byte de-interleaver 24-2, the bitwise decoding result as selecting one of the outputs from the Viterbi decoding unit 23-2 and byte interleaver 26 on the basis of the decoding stop flag provided from the decode stop determination unit 28. For example, the selector 33 selects the output from the Viterbi decoding unit 23-2 when the level of the decoding stop flag is the L level and selects the output from the byte interleaver 26 when the level of the decoding stop flag is the H level.

The byte de-interleaver 24-2 converts the bitwise decoding result provided via the selector 33 into a bytewise decoding result. Then, the byte de-interleaver 24-2 serves as a delay unit and performs de-interleaving by delaying a part of the bytewise decoding result obtained as a result of converting.

The RS decoding unit 25-2 performs RS decoding on the bytewise decoding result, which is de-interleaved by the byte de-interleaver 24-2. The RS decoding unit 25 outputs, to outside, a decoding success flag, which expresses whether or not the decoded data obtained as a result and decoding are succeeded.

The bit error counter 29 serves as a calculating unit. The bit error counter 29 accumulates the number of error bits on the basis of the decoding success flag that is output from the RS decoding unit 25-1 and the number of corrected bits as well as a fixed number of error bits and a period for measuring the number of bit errors input from outside.

For example, when the decoding success flag from the RS decoding unit 25-1 is the H level indicating a decoding success, the bit error counter 29 accumulates the number of corrected bits. On the other hand, when the decoding success flag from the RS decoding unit 25-1 is the L level indicating a decoding failure, the bit error counter 29 accumulates the fixed number of error bits regardless of the number of corrected bits. Then, the bit error counter 29 outputs the accumulated number of bit errors at a timing when the bit error measurement period starts.

Here, the bit error counter 29 may accumulate the number of corrected bits on the basis of the output from the RS decoding unit 25-2, not the output from the RS decoding unit 25-1. Further, there may be a configuration for inputting a selection signal to the bit error counter 29 to select from outside which outputs from the RS decoding unit 25-1 or RS decoding unit 25-2 the bit error counter 29 uses to accumulate the number of corrected bit, for example.

The error correction unit 15B having the above configuration can obtain the same decoding performance with the equivalent power consumption and reduce the memory capacity about a half, compared to the error correction unit 15 of FIG. 2, that is, a configuration in which decoding is performed two times, for example.

[First Modification Example of Third Configuration Example of Error Correction Unit]

Figure 13:
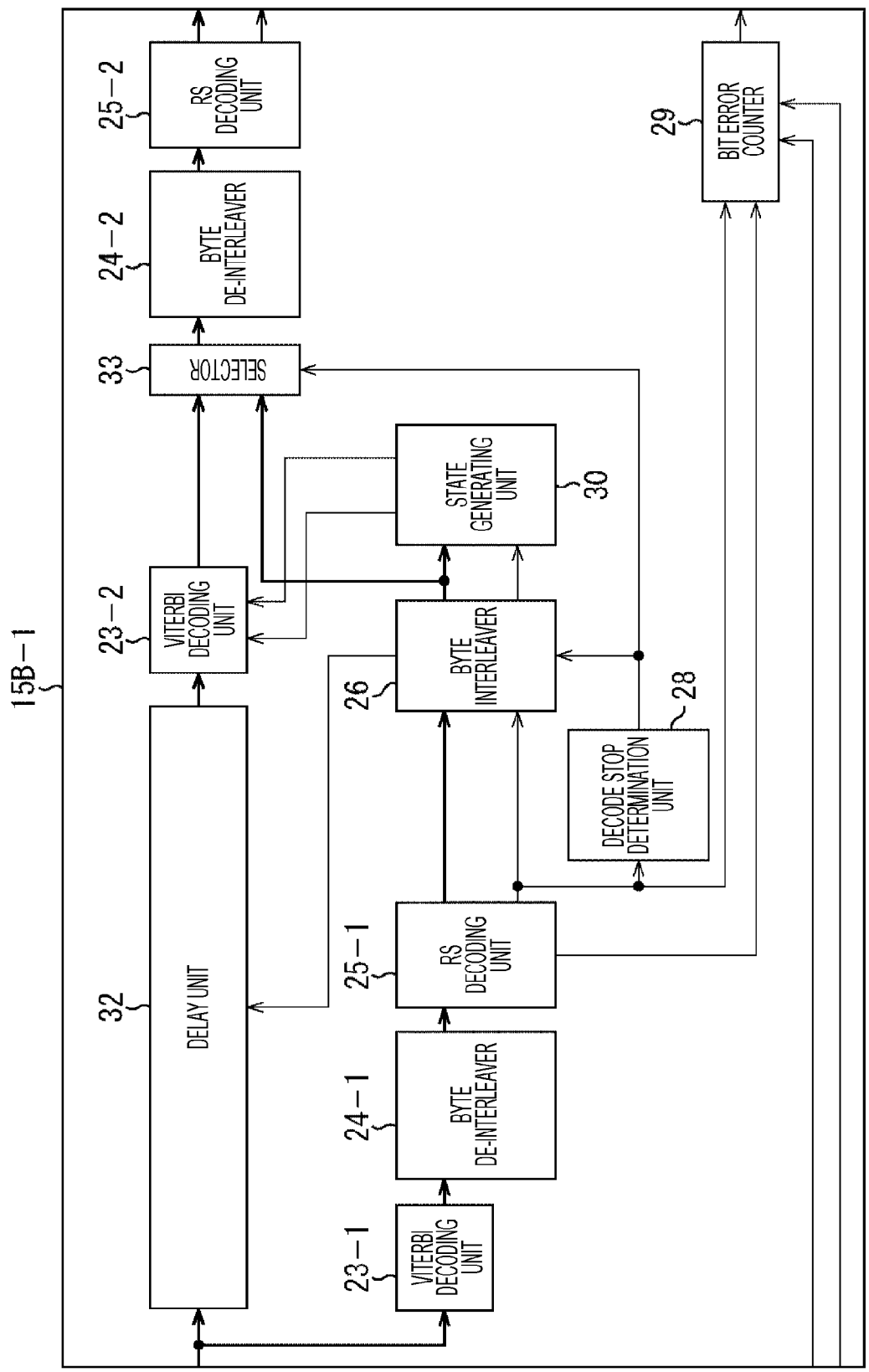
FIG. 13 is a block diagram illustrating a first modification example of the third configuration example of the error correction unit of FIG. 1.

Next, FIG. 13 is a block diagram illustrating a first modification example of the third configuration example (FIG. 12) of the error correction unit 15 of FIG. 1. Here, among the blocks composing the error correction unit 15B-1 illustrated in FIG. 13, same reference numerals are applied to the blocks common with those in the error correction unit 15B illustrated in FIG. 12 and the detailed explanation thereof will be omitted.

In other words, the error correction unit 15B-1 has a configuration common with the error correction unit 15B of FIG. 12 in that the delay unit 32, Viterbi decoding units 23-1 and 23-2, byte de-interleavers 24-1 and 24-2, RS decoding units 25-1 and 25-2, byte interleaver 26, decode stop determination unit 28, selector 33, and bit error counter 29 are included. Here, the error correction unit 15B-1 is different from the error correction unit 15B of FIG. 12 in that the state generating unit 30 is included as a substitute for the likelihood converting unit 22 and convolutional encoding unit 27 of FIG. 12.

In other words, in the error correction unit 15B-1, the decoded data and decoding success flag output from the byte interleaver 26 are provided to the state generating unit 30. Then, similarly to the state generating unit 30 of the error correction unit 15-1 illustrated in FIG. 6, the state generating unit 30 generates a state and reliability information of the state on the basis of the bytewise decoded data and decoding success flag provided from the byte interleaver 26. Then, the state generating unit 30 provides the state and reliability information of the state to the Viterbi decoding unit 23-2.

Accordingly, with the state generating unit 30, the error correction unit 15B-1 can improve the decoding error performance compared to the error correction unit 15B of FIG. 12 and can reduce the power consumption similarly to the error correction unit 15B of FIG. 12.

[Second Modification Example of Third Configuration Example of Error Correction Unit]

Figure 14:
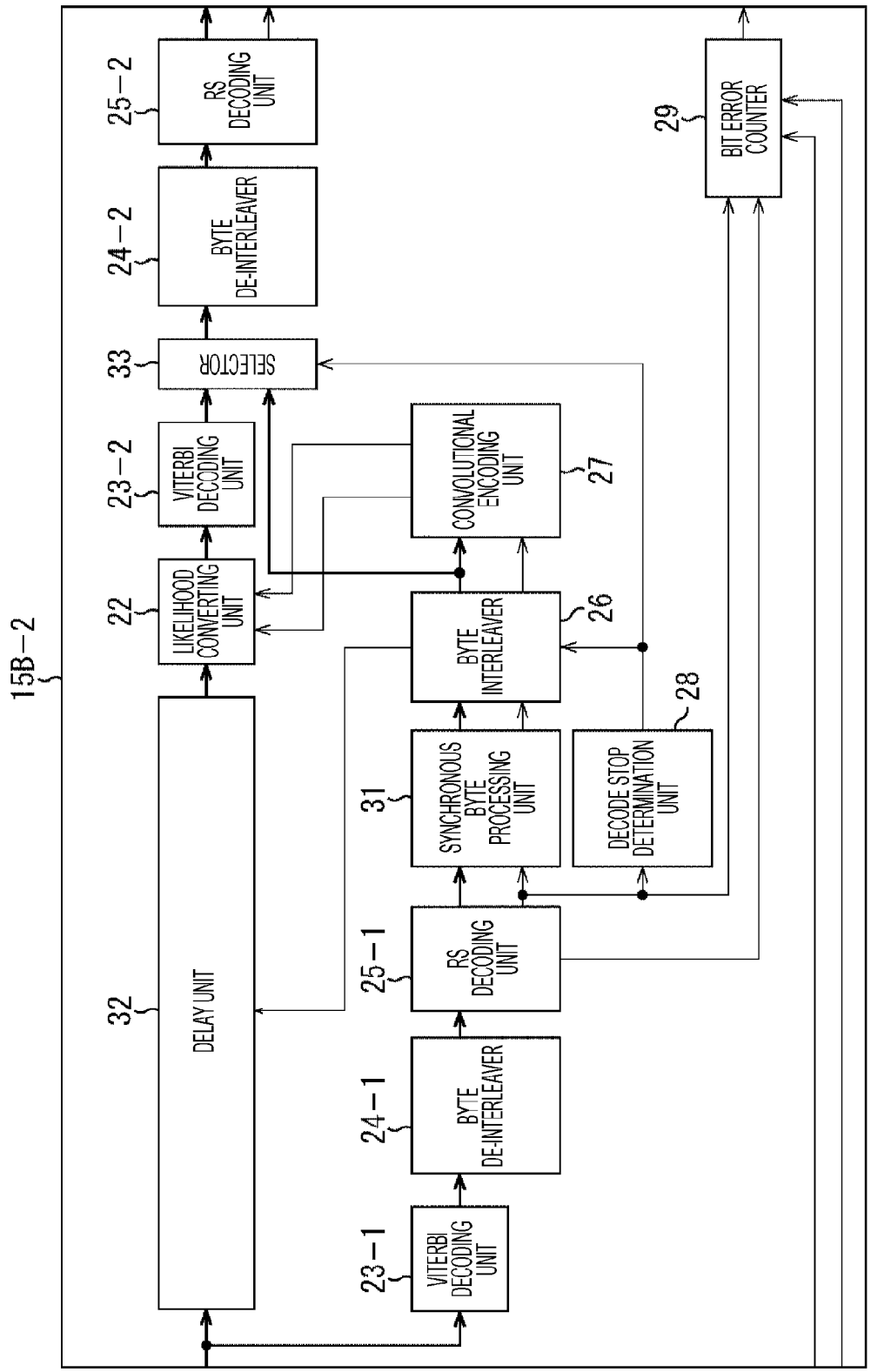
FIG. 14 is a block diagram illustrating a second modification example of the third configuration example of the error correction unit of FIG. 1.

Next, FIG. 14 is a block diagram illustrating a second modification example of the third configuration example (FIG. 12) of the error correction unit 15 in FIG. 1. Here, among the blocks composing the error correction unit 15B-2 illustrated in FIG. 14, same reference numerals are applied to the blocks common with those in the error correction unit 15B illustrated in FIG. 12 and the detailed explanation thereof will be omitted.

In other words, the error correction unit 15B-2 has a configuration common with the error correction unit 15B of FIG. 12 in that the delay unit 32, likelihood converting unit 22, Viterbi decoding units 23-1 and 23-2, byte de-interleavers 24-1 and 24-2, RS decoding units 25-1 and 25-2, byte interleaver 26, convolutional encoding unit 27, decode stop determination unit 28, selector 33, and bit error counter 29 are included. Here, the error correction unit 15B-2 is different from the error correction unit 15B of FIG. 12 in that the synchronous byte processing unit 31 is included.

In other words, in the error correction unit 15B-2, the decoded data and decoding success flag output from the RS decoding unit 25-1 are provided to the synchronous byte processing unit 31 and the decoded data and decoding success flag are provided from the synchronous byte processing unit 31 to the byte interleaver 26. In this case, as described above with reference to FIG. 8, the synchronous byte processing unit 31 serves as a replacement unit and replaces a value of the synchronous byte in the bytewise decoded data output from the RS decoding unit 25-1 into a predetermined value for example.

Accordingly, with the synchronous byte processing unit 31, the error correction unit 15B-2 can improve the performance compared to the error correction unit 15B of FIG. 12 and can reduce the power consumption similarly to the error correction unit 15B of FIG. 12.

Here, the synchronous byte processing unit 31 included in the error correction unit 15B-2 may be a configuration included in the error correction unit 15B-1 of FIG. 11, for example. Further, the state generating unit 30 included in the error correction unit 15B-1 of FIG. 13 may be a configuration included in the error correction unit 15B of FIG. 12 or a configuration included in the error correction unit 15B-2 of FIG. 14, for example.

[Fourth Configuration Example of Error Correction Unit]

Figure 15:
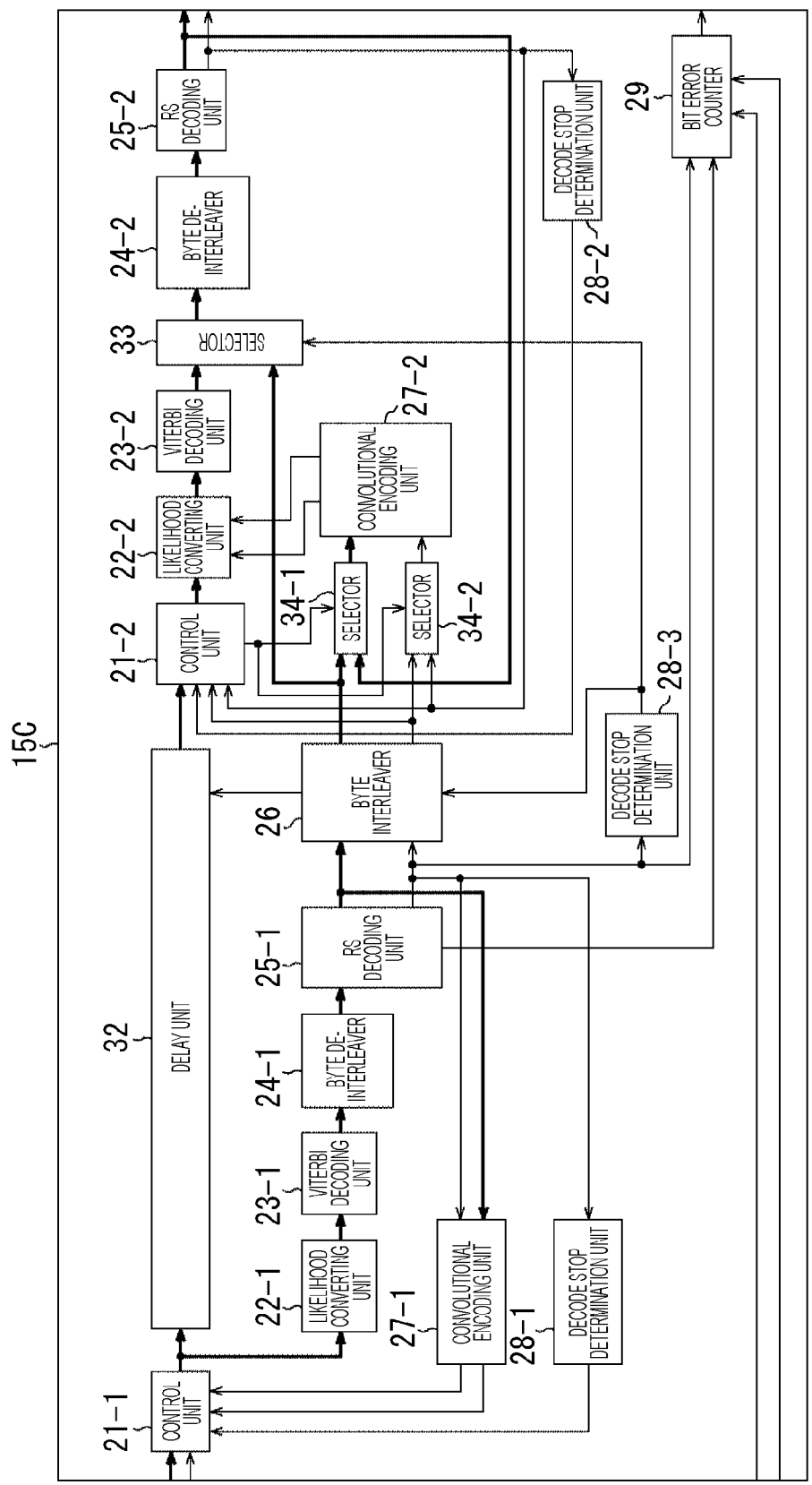
FIG. 15 is a block diagram illustrating a fourth configuration example of the error correction unit of FIG. 1.

FIG. 15 is a block diagram illustrating a fourth configuration example of the error correction unit 15 in FIG. 1. Here, among the blocks composing the error correction unit 15C of FIG. 15, same reference numerals are applied to the blocks common with those in the error correction unit 15B of FIG. 12 and the detailed explanation thereof will be omitted.

As illustrated in FIG. 15, the error correction unit 15C has a configuration common with the error correction unit 15B of FIG. 12 in that the delay unit 32, Viterbi decoding units 23-1 and 23-2, byte de-interleavers 24-1 and 24-2, RS decoding units 25-1 and 25-2, byte interleaver 26, selector 33, and bit error counter 29 are included. Here, the error correction unit 15C is different from the error correction unit 15B of FIG. 12 in that a couple of control units 21, a couple of likelihood converting units 22, and a couple of convolutional encoding units 27 are included. Further, the error correction unit 15C is different from the error correction unit 15B of FIG. 12 in that three decode stop determination units 28 and two selectors 34 are included.

Here, the likelihood converting units 22-1 and 22-2, Viterbi decoding units 23-1 and 23-2, convolutional encoding units 27-1 and 27-2, and decode stop determination unit 28-3, which are included in error correction unit 15C, operate similarly to the likelihood converting unit 22, Viterbi decoding unit 23, convolutional encoding unit 27, and decode stop determination unit 28, which have been explained with reference to FIG. 2, respectively.

Further, the control unit 21-1, byte de-interleavers 24-1 and 24-2, RS decoding units 25-1 and 25-2, decode stop determination units 28-1 and 28-2, which are included in the error correction unit 15C, operate similarly to the control unit 21, byte de-interleaver 24, RS decoding unit 25, and decode stop determination unit 28, which have been explained with reference to FIG. 9, respectively.

Further, the byte interleaver 26, delay unit 32, selector 33, and bit error counter 29, which are included in error correction unit 15C, operate similarly to the byte interleaver 26, delay unit 32, selector 33, and bit error counter 29, which have been described with reference to FIG. 12, respectively.

Thus, in the following, operations of the control unit 21-2, and selectors 34-1 and 34-2 will be explained.

The selector 34-1 selects one of byte data output from the byte interleaver 26 and byte data output from the RS decoding unit 25-2, according to a select signal provided from the control unit 21-2 and provides the data to the convolutional encoding unit 27-2.

The selector 34-2 selects one of the decoding success flag output from the byte interleaver 26 and the decoding success flag output from the RS decoding unit 25-2, according to a select signal provided from the control unit 21-2 and provides the data to the convolutional encoding unit 27-2.

To the control unit 21-2, a likelihood is provided from the delay unit 32, a decoding success flag is provided from the byte interleaver 26, a decoding success flag is provided from the RS decoding unit 25-2, and a decoding stop flag is provided from the decode stop determination unit 28-2.

In the error correction unit 15C, the control unit 21-2 has an internally mounted memory to store an input likelihood and maintains a decoding success flag attached with the likelihood. Then, the control unit 21-2 performs reading of a same likelihood from the memory once or twice. It is determined whether the control unit 21-2 performs second reading of the reading of the same likelihood according to the decoding stop flag generated in the decode stop determination unit 28-2 on the basis of information obtained from the decoding result of Viterbi decoding and RS decoding of the likelihood, which is read in the first reading. In other words, the control unit 21-2 performs the second reading of the same likelihood when the level of the decoding stop flag is the L level and does not perform the second reading of the same likelihood when the level of the decoding stop flag is the H level.

Further, when the decoding success flag is input from the byte interleaver 26, the control unit 21-2 outputs a select signal, which indicates to select an output from the byte interleaver 26, to the selectors 34-1 and 34-2. Further, when outputting for the first time, the control unit 21-2 outputs the likelihood input from the delay unit 32 to the likelihood converting unit 22-2. In this case, the control unit 21-2 outputs the likelihood corresponding to the timing when the encoding bit and reliability information, which are generated in the convolutional encoding unit 27-2 using the data selected by the selectors 34-1 and 34-2 according to the select signal, is provided to the likelihood converting unit 22-2.

Further, when performing the second reading of the likelihood, the control unit 21-2 reads the likelihood from the memory and also reads a decoding success flag attached to the likelihood at the timing when a decoding success flag from the RS decoding unit 25-2 is input. Then, when the read success flag is the H level indicating a decoding success, the control unit 21-2 outputs a select signal, which indicates to select an output from the byte interleaver 26, to the selectors 34-1 and 34-2.

On the other hand, when the success flag is the L level indicating a decoding failure, the control unit 21-2 outputs a select signal, which indicates to select an output from the RS decoding unit 25-2, to the selectors 34-1 and 34-2 if information bit after the Viterbi decoding on the likelihood to be output is a part of bytes which have passed through the zero delay branch in the byte de-interleaver 24-2. In this case, similarly to the first output of the likelihood, the control unit 21-2 outputs the likelihood for the second time, corresponding to the timing when the encoding bit and reliability information generated in the convolutional encoding unit 27-2 are provided to the likelihood converting unit 22-2.

The error correction unit 15C having the above configuration is a combination of the error correction unit 15A (the second configuration example) of FIG. 9 and the error correction unit 15B (the third configuration example) of FIG. 12. Thus, the error correction unit 15C can improve the performance compared to the error correction unit 15B of FIG. 12 almost without increasing the circuit scale and consumed power compared to those of the error correction unit 15B of FIG. 12.

Here, similarly to the error correction unit 15-2 of FIG. 8, the error correction unit 15C may have a configuration including the synchronous byte processing unit 31. Further, similarly to the error correction unit 15-1 of FIG. 6, the error correction unit 15C may have a configuration including the state generating unit 30 as a substitute for the likelihood converting units 22-1 and 22-2 and convolutional encoding units 27-1 and 27-2. Further, as combining those configurations, the error correction unit 15C may have a configuration including the synchronous byte processing unit 31 and state generating unit 30. Here, in the error correction unit 15C, signals compatible with the DVB-T standard can be decoded by further including an energy inverse disperser compatible with the DVB-T standard in a later stage in the RS decoding unit 25-2.

Here, the bit error counter 29 may accumulate the number of corrected bits on the basis of the first output of the RS decoding unit 25-1 or the second output of the RS decoding unit 25-1. Or, the bit error counter 29 may accumulate the number of corrected bits on the basis of the first output of the RS decoding unit 25-2 or the second output of the RS decoding unit 25-2. Further, there may be a configuration to input a selection signal to the bit error counter 29, for example, so as to select from outside from which of the first or second output of the RS decoding unit 25-1 and the first or second output of the RS decoding unit 25-2, the bit error counter 29 accumulates the number of corrected bits.

[Fifth Configuration Example of Error Correction Unit]

Figure 16:
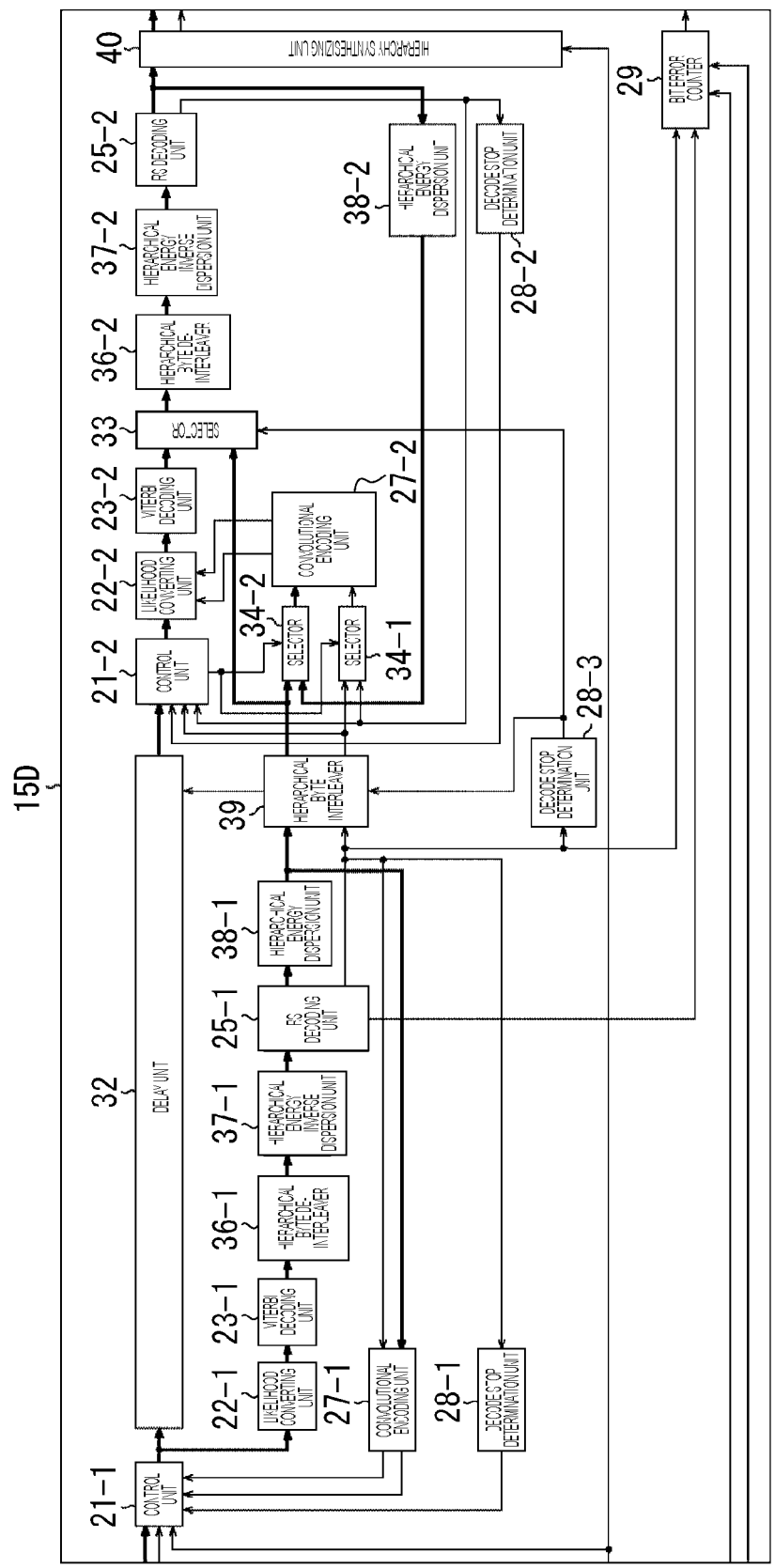
FIG. 16 is a block diagram illustrating a fifth configuration example of the error correction unit of FIG. 1.

FIG. 16 is a block diagram illustrating a fifth configuration example of the error correction unit 15 of FIG. 1. Here, among the blocks composing the error correction unit 15D of FIG. 16, same reference numerals are applied to the blocks common with those in the error correction unit 15C of FIG. 15 and the detailed explanation thereof will be omitted.

As illustrated in FIG. 16, the error correction unit 15D has a configuration common with the error correction unit 15C of FIG. 15 in that the delay unit 32, control units 21-1 and 21-2, likelihood converting units 22-1 and 22-2, Viterbi decoding units 23-1 and 23-2, RS decoding units 25-1 and 25-2, convolutional encoding units 27-1 and 27-2, decode stop determination units 28-1 to 28-3, selector 33, selectors 34-1 and 34-2, and bit error counter 29 are included.

Here, the error correction unit 15D is different from the error correction unit 15C of FIG. 15 in that hierarchical byte de-interleavers 36-1 and 36-2 and a hierarchical byte interleaver 39 are included as a substitute for the byte de-interleavers 24-1 and 24-2 and byte interleavers 26. Further, the error correction unit 15D is different from the error correction unit 15C of FIG. 15 in that hierarchical energy inverse dispersion units 37-1 and 37-2, hierarchical energy dispersion units 38-1 and 38-2, and a hierarchy synthesizing unit 40 are included.

In this manner, the error correction unit 15D has a configuration that the error correction unit 15C illustrated in FIG. 15 is made to be compatible to the ISDB-T standard and hierarchy information and segment information are added as input information. Here, the hierarchy information is transmitted and received between the respective blocks, as being synchronized with data.

In the following, the hierarchical byte de-interleavers 36-1 and 36-2, hierarchical byte interleavers 39, hierarchical energy inverse dispersion units 37-1 and 37-2, hierarchical energy dispersion units 38-1 and 38-2, hierarchy synthesizing unit 40, and bit error counter 29, which operate differently from the error correction unit 15C of FIG. 15, will be explained. Here, since the hierarchical byte de-interleaver 36-2 operates similarly to the hierarchical byte de-interleaver 36-1, only the hierarchical byte de-interleaver 36-1 will be explained. In a similar way, since the hierarchical energy inverse dispersion unit 37-2 operates similarly to the hierarchical energy inverse dispersion unit 37-1, only the hierarchical energy inverse dispersion unit 37-1 will be explained. In the a similar way, since the hierarchical energy dispersion unit 38-2 operates similarly to the hierarchical energy dispersion unit 38-1, only the hierarchical energy dispersion unit 38-1 will be explained.

For example, according to the ISDB-T standard, there are three hierarchies (A, B, and C), and byte interleaving is performed on data in the respective hierarchies in the transmission side. Thus, the hierarchical byte de-interleaver 36-1 performs inverse conversion on data in the respective hierarchies. In other words, the hierarchical byte de-interleaver 36-1 converts a bitwise decoding result provided from the Viterbi decoding unit 23-1 into a bytewise decoding result. After that, the hierarchical byte de-interleaver 36-1 performs de-interleaving of the hierarchy specified by the input hierarchy information on the bytewise decoding result obtained as a result of the conversion and outputs the result.

In a similar way, according to the ISDB-T standard, there are three hierarchies (A, B, and C), and energy dispersion is performed in the respective hierarchies in the transmission side. Thus, the hierarchical energy inverse dispersion unit 37-1 performs inverse conversion on the data of the respective hierarchies. In other words, in the hierarchical energy inverse dispersion unit 37-1, the byte data and hierarchy information are input from the hierarchical byte de-interleaver 36-1, energy inverse dispersion is performed on the input byte data in the hierarchy specified by the input hierarchy information, and the data is output.

Further, according to the ISDB-T standard, there are three hierarchies (A, B, and C), and the hierarchical energy dispersion unit 38-1 performs energy dispersion similarly to the transmission side on the basis of the energy dispersion performed in the respective hierarchies in the transmission side. In other words, in the hierarchical energy dispersion unit 38-1, byte data and hierarchy information are input from the RS decoding unit 25-1 and energy dispersion in the hierarchy specified by the input hierarchy information is performed on the input data, and the data is output.

To the hierarchy synthesizing unit 40, the decoded data and segment information from the RS decoding unit 25-2 are input. Here, since the outputs from the error correction unit 15D need to be output in order of the input hierarchies of the error correction unit 15D, a modulation scheme, a code rate or the like can be set for each hierarchy, and thus each hierarchy may have a different bit rate. Accordingly, the hierarchy synthesizing unit 40 includes an output adjustment buffer for adjusting the order of outputs according to the order of the inputs to output data in the order corresponding to the order of the inputs.

In the bit error counter 29, the RS decoding success flag and the number of corrected bits output from the RS decoding unit 25-1 and the bit error measurement period and fixed number of error bits from outside are input and the number of error bits is accumulated.

Here, the bit error counter 29 performs the accumulation of the number of error bits of only the data which is read by the control unit 21 in the first time and RS decoded. Specifically, when the level of the decoding success flag is the H level (decoding success), the bit error counter 29 accumulates the number of corrected bits within the period of measuring the number of bit errors. On the other hand, when the level of the decoding success flag is the L level (decoding failure), the bit error counter 29 accumulates the fixed number of error bits within the period of measuring the number of bit errors. The bit error counter 29 outputs the accumulated number of bits as the number of bit errors to outside for every period of measuring the number of bit errors.

Here, the bit error counter 29 may accumulate the number of corrected bits on the basis of the output from the RS decoding unit 25-2 other than the output from the RS decoding unit 25-1. Further, there may be a configuration for inputting a selection signal to the bit error counter 29 for example so as to select from outside from which of the outputs of the RS decoding unit 25-1 and RS decoding unit 25-2 the bit error counter 29 accumulates the number of corrected bits. Further, there may be a configuration that bit errors in each hierarchy are counted by inputting hierarchy information to the bit error counter 29.

In the error correction unit 15D having the above configuration, when a signal compatible with the ISDB-T standard is received, a decoding performance equivalent to the error correction unit 15C of FIG. 15 can be obtained in all the hierarchies while suppressing the power consumption.

[Modification Example of Fifth Configuration Example of Error Correction Unit]

Figure 17:
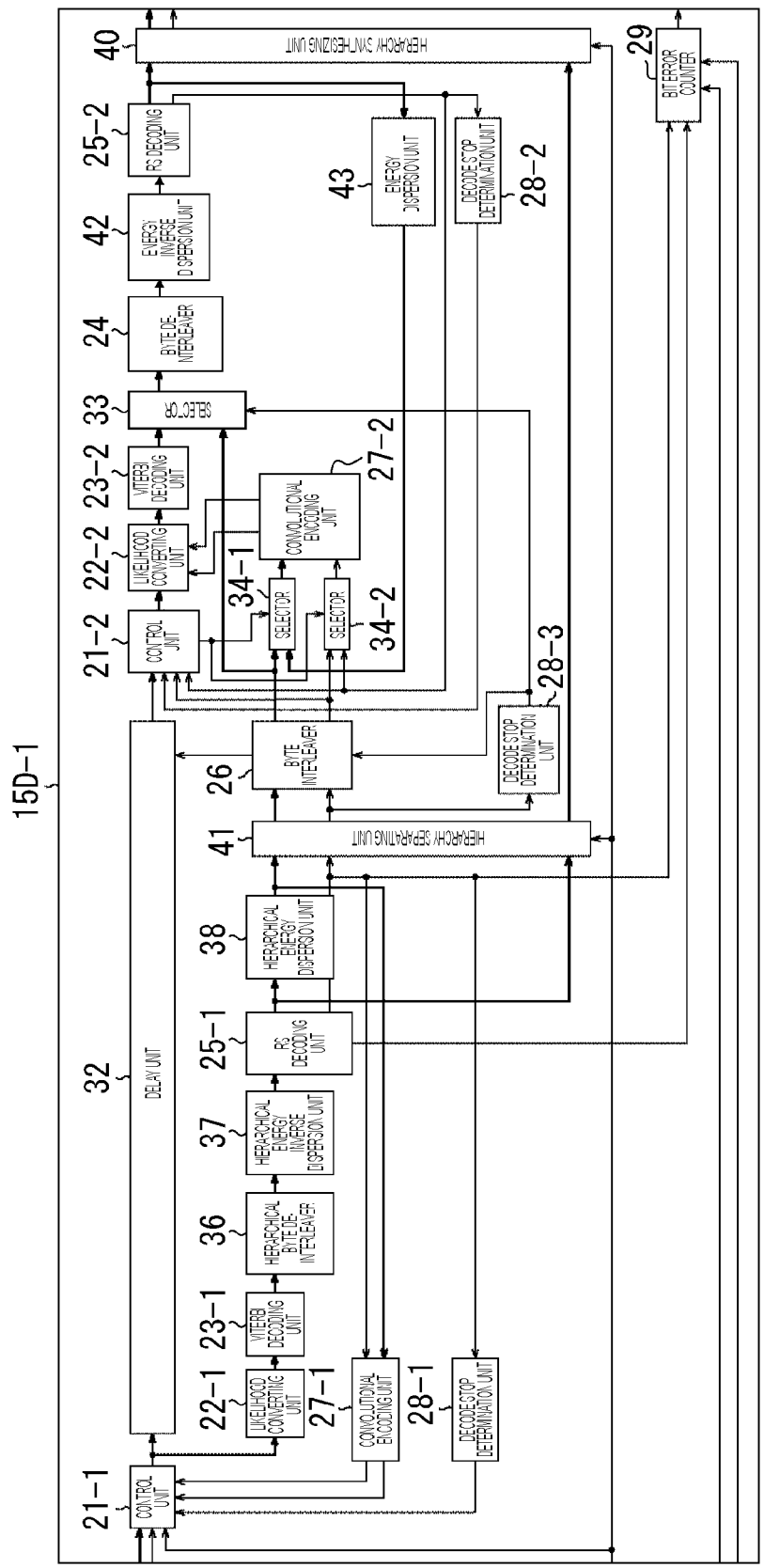
FIG. 17 is a block diagram illustrating a modification example of the fifth configuration example of the error correction unit of FIG. 1.

Next, FIG. 17 is a block diagram illustrating a modification example of the fifth configuration example (FIG. 16) of the error correction unit 15 in FIG. 1. Here, among the blocks composing the error correction unit 15D-1 of FIG. 17, same reference numerals are applied to the blocks common with those in the error correction unit 15D of FIG. 16 and the detailed explanation thereof will be omitted.

In other words, the error correction unit 15D-1 has a configuration common with the error correction unit 15D of FIG. 16 in that the delay unit 32, control units 21-1 and 21-2, likelihood converting units 22-1 and 22-2, Viterbi decoding units 23-1 and 23-2, RS decoding units 25-1 and 25-2, convolutional encoding units 27-1 and 27-2, decode stop determination units 28-1 to 28-3, selector 33, selectors 34-1 and 34-2, hierarchical byte de-interleaver 36, hierarchical energy inverse dispersion unit 37, hierarchical energy dispersion unit 38, hierarchy synthesizing unit 40, and bit error counter 29 are included.

Here, the error correction unit 15D-1 has a configuration different from the error correction unit 15D of FIG. 16 in that a hierarchy separating unit 41 is added, a byte interleaver 26 is included as a substitute for the hierarchical byte interleaver 39 of FIG. 16, a byte de-interleaver 24 is included as a substitute for the hierarchical byte de-interleaver 36-2, an energy inverse dispersion unit 42 is included as a substitute for the hierarchical energy inverse dispersion unit 37-2, and an energy dispersion unit 43 is included as a substitute for the hierarchical energy dispersion unit 38-2.

Here, the error correction unit 15D of FIG. 16 has a configuration that the hierarchy synthesizing unit 40 includes an output adjustment buffer and the buffer capacity is supposed to be large. However, the buffer capacity can be suppressed by restricting the hierarchy that operates after the hierarchical byte interleaver 39 of the error correction unit 15D in FIG. 16 with a segment configuration.

For example, as a first combination, in case of one hierarchy (one of A, B, and C), the operation is similar to the error correction unit 15C of FIG. 15. Further, as a second combination, in a case of one segment in A hierarchy and twelve segments in B hierarchy, the data in A hierarchy is output from the RS decoding unit 25-1, the data in B hierarchy is output from the RS decoding unit 25-2, and the hierarchy synthesizing unit 40 outputs in order of inputs. Further, as a third combination, in a case other than the first and second combinations, the data in all the hierarchies is output from the RS decoding unit 25-1.

The error correction unit 15D-1 is configured in assumption of the operations in those combinations. Then, in the error correction unit 15D-1, the blocks that perform operation different from the error correction unit 15D of FIG. 16 are the control unit 21-1, byte de-interleaver 24, byte interleaver 26, energy inverse dispersion unit 42, energy dispersion unit 43, hierarchy synthesizing unit 40, and hierarchy separating unit 41. Here, the byte de-interleaver 24 and byte interleaver 26 perform operation similarly to the error correction unit 15 of FIG. 2 and, since the energy inverse dispersion unit 42 and energy dispersion unit 43 correspond to one hierarchy of the hierarchical energy inverse dispersion unit 37-2 and hierarchical energy dispersion unit 38-2 of the error correction unit 15D of FIG. 16, the explanation thereof will be omitted.

In the following, operations of the control unit 21-1, hierarchy separating unit 41, and hierarchy synthesizing unit 40 will be described.

The control unit 21-1 basically operates similarly to the control unit 21 of the error correction unit 15A of FIG. 9. Here, the parts different from the control unit 21 of the error correction unit 15A of FIG. 9 are, firstly, that the input information further includes hierarchy information and segment information and, secondly, that hierarchies to output to the delay unit 32 are switched according to the segment information. Here, as the outputs to the likelihood converting unit 22-1, data of all hierarchies is output.

When the segment information indicates only one hierarchy (one of A, B, and C), the control unit 21-1 outputs data of the hierarchy to the delay unit 32. Further, when the segment information indicates one segment of A hierarchy and twelve segments of B hierarchy, the control unit 21-1 outputs only data for B hierarchy to the delay unit 32. Further, when the segment information indicates other information (not the case of only one hierarchy nor the case of one segment of A hierarchy and twelve segments of B hierarchy), the control unit 21-1 does not output data to the delay unit 32.

To the hierarchy separating unit 41, decoded data, decoding success flag, hierarchy information, and segment information are input from the RS decoding unit 25-1. Then, the hierarchy separating unit 41 outputs data according to the segment information as described below.

In other words, when the segment information indicates only one hierarchy, the hierarchy separating unit 41 outputs data of the hierarchy to the byte interleaver 26 and does not output data to the hierarchy synthesizing unit 40. Further, when the segment information indicates one segment of A hierarchy and twelve segments of B hierarchy, the hierarchy separating unit 41 outputs data of A hierarchy to the hierarchy synthesizing unit 40 and only the data of B hierarchy to the byte interleaver 26. Further, when the segment information is not one hierarchy nor one segment of A hierarchy and twelve segments of B hierarchy, the hierarchy separating unit 41 does not output data to the byte interleaver 26.

To the hierarchy synthesizing unit 40, decoded data and decoding success flag from the RS decoding unit 25-2, output data and segment information from the hierarchy separating unit 41 are input. Then, the hierarchy synthesizing unit 40 outputs data according to the segment information as described below.

In other words, when the segment information indicates one hierarchy, the hierarchy synthesizing unit 40 outputs decoded data and decoding success flag from the RS decoding unit 25-2.

Further, when the segment information indicates one segment of A hierarchy and twelve segments of B hierarchy, in the hierarchy synthesizing unit 40, data of A hierarchy is provided from the hierarchy separating unit 41 and twelve segments of B hierarchy is provided from the RS decoding unit 25-2. In this case, the hierarchy synthesizing unit 40 outputs the data of A hierarchy as delaying the output using the memory or the like to output in order of the hierarchies input to the error correction unit 15D-1. For example, the hierarchy separating unit 41 may apply a serial number to the decoded data from the RS decoding unit 25-1 for every amount of one packet regardless of the hierarchies, the output data of each module are synchronized with the serial numbers between the byte interleaver 26 and the RS decoding unit 25-2, and the hierarchy synthesizing unit 40 may output the data in order of the serial numbers so that the data can be output in order of the hierarchies input to the error correction unit 15D-1.

Further, when the segment information does not indicate only one hierarchy nor one segment of A hierarchy and twelve segments of B hierarchy, the hierarchy synthesizing unit 40 output data from the hierarchy separating unit 41.

The error correction unit 15D-1 having the above configuration can provide the performance equivalent to the error correction unit 15D of FIG. 16 as suppressing the output adjustment buffer of the error correction unit 15D of FIG. 16 in the case that the segment information indicates only one hierarchy. Further, the error correction unit 15D-1 can also provide an improvement of the performance in the case of one segment of A hierarchy and twelve segments of B hierarchy, that is, the case of an segment configuration, which is actually in use.

Here, similarly to the error correction unit 15-2 of FIG. 8, the error correction unit 15D of FIG. 16 and the error correction unit 15D-1 of FIG. 17 may have a configuration including the synchronous byte processing unit 31. Further, similarly to the error correction unit 15-1 of FIG. 6, the error correction unit 15D of FIG. 16 and the error correction unit 15D-1 of FIG. 17 may have a configuration including the state generating unit 30 as a substitute for the likelihood converting units 22-1 and 22-2 and convolutional encoding units 27-1 and 27-2. Further, by combining the above configurations, the error correction unit 15D of FIG. 16 and the error correction unit 15D-1 of FIG. 17 may have a configuration including the synchronous byte processing unit 31 and state generating unit 30.

As described above, in the above described error correction unit 15 of each embodiment and each modified example, when all the data stored in the byte interleaver 26 (a convolutional interleaver) is succeeded or failed in RS decoding, the condition is detected by the decode stop determination unit 28. Then, in such as case, in the error correction unit 15, Viterbi decoding on the subsequent same data by the Viterbi decoding unit 23 is stopped, the access to the memory for byte interleaving by the byte interleaver 26 is stopped, and RS decoding by the RS decoding unit 25 is stopped. With this configuration, the error correction unit 15 can suppress the power consumption while preventing the decoding performance from being deteriorated.

Further, the error correction unit 15 may have a configuration that only the data which has passed through the zero delay branch in the byte interleaver 26 among the outputs from the RS decoding unit 25 are input to the convolutional encoding unit 27. In the configuration, when the first RS decoding is successful, in the error correction unit 15, only the data which has passed through the zero delay branch is input to the convolutional encoding unit 27. Then, the error correction unit 15 may execute second Viterbi decoding and updates only the data by the byte interleaver 26, so that the second RS decoding is not executed. With this configuration, the error correction unit 15 can reduce the power consumption of the first RS decoding while preventing the performance from being deteriorated. Further, the error correction unit 15 can avoid the delay of the first RS decoding while preventing the performance from being deteriorated.

Then, in this configuration, when the first RS decoding is failed, the error correction unit 15 can have a configuration that second Viterbi decoding is not executed, the update of the data by the byte interleaver 26 is not executed, and second RS decoding is not executed. With this configuration, the error correction unit 15 can reduce the power consumption for Viterbi decoding for one time, data update by the byte interleaver 26, and RS decoding for one time while preventing the performance from being deteriorated. Further, the error correction unit 15 can avoid delay of RS decoding for one time while preventing the performance from deteriorated.

[Explanation of Computer to which Present Technology is Applied]

The above described series of processes may be executed by hardware or may be executed by software. When the series of processes are executed by software, programs composing the software are installed to a computer. Here, the computer may be a computer mounted to a dedicated hardware, a general personal computer which can execute various functions by installing various programs, or the like, for example.

Figure 18:
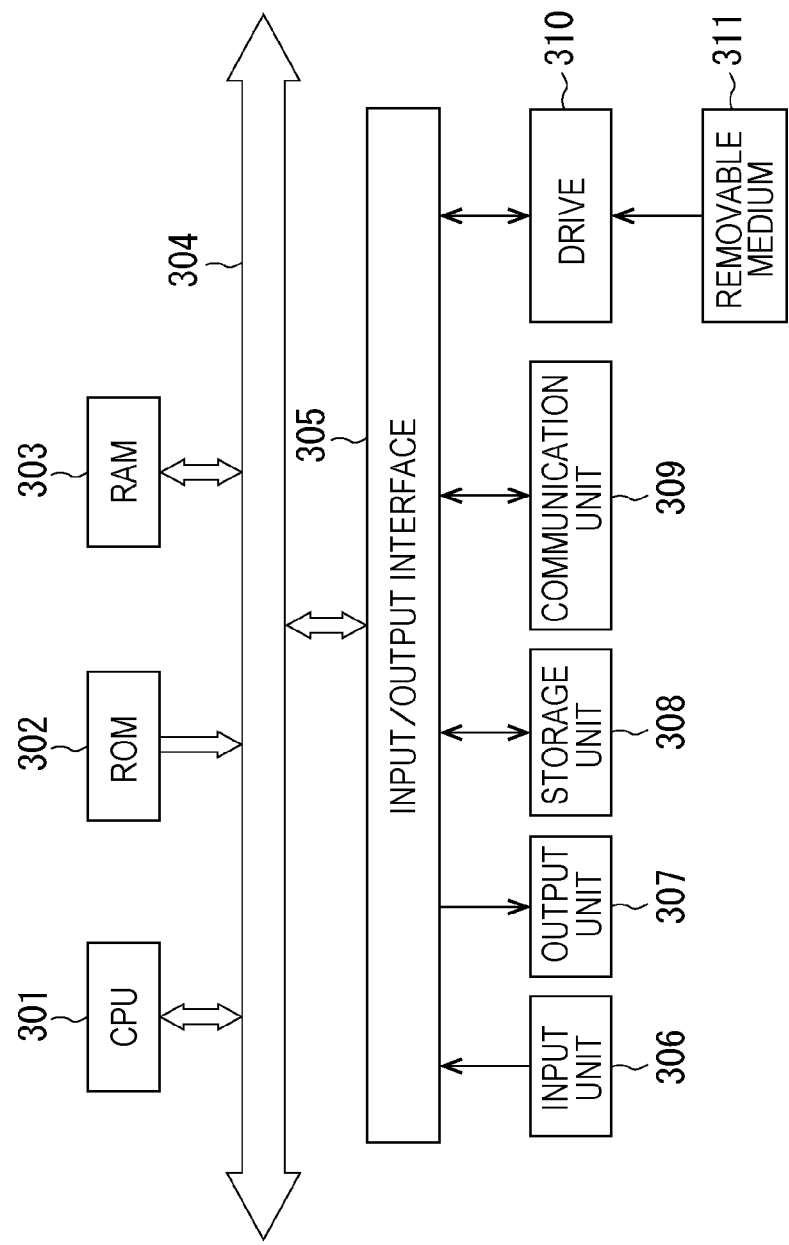
FIG. 18 is a block diagram illustrating a configuration example of hardware of a computer.

FIG. 18 is a block diagram illustrating a configuration example of hardware of a computer that executes the above described series of processes using a program.

In the computer, a central processing unit (CPU) 301, a read only memory (ROM) 302, a random access memory (RAM) 303 are connected to one another via a bus 304.

To the bus 304, an input/output interface 305 is further connected. To the input/output interface 305, an input unit 306, an output unit 307, a storage unit 308, a communication unit 309, and a driver 310 are connected.

The input unit 306 is composed of a keyboard, a mouse, a microphone, or the like. The output unit 307 is composed of a display, a speaker, or the like. The storage unit 308 is composed of a hard disk, a non-volatile memory, or the like. The communication unit 309 is composed of a network interface or the like. The driver 310 drives a removable medium 311 such as a magnetic disk, an optical disk, a magneto-optical disk, a semiconductor memory, or the like.

In the computer having the above described configuration, the above described series of processes is executed by that the CPU 301 executes the program stored in the storage unit 308, for example, by loading the program to the RAM 303 via the input/output interface 305 and bus 304.

The program executed by the computer (CPU 301) may be provided by recoding in a removable medium 311 as a portable medium or the like, for example. Further, the program may be provided via a wired or wireless transmission medium such as a local area network, the Internet, and terrestrial digital satellite broadcasting.

In the computer, the program may be installed to the storage unit 308 via the input/output interface 305 by attaching the removable medium 311 to the driver 310. Further, the program may be received from the communication unit 309 via a wired or wireless transmission medium and installed to the storage unit 308. Besides, programs may be installed to the ROM 302 or storage unit 308 in advance.

Here, the program executed by the computer may be a program in which the processes are executed in chronological order according to the order explained in this specification or may be a program in which the processes are executed in parallel or executed at a necessary timing when a request is sent, for example.

Further, the embodiment according to the present technology is not limited to the above described embodiment and various changes may be made within the scope of the present technology.

For example, the present technology may also be applied to a receiving device, which is compliant with a standard other than ISDB-T standard. For example, the present technology may be applied to a receiving device compliant with the DVB-T standard, the ATSC standard, the ISDB-S standard, and the DVB-S standard rather than the ISDB-T standard in which an RS code is used as an external code and a convolutional code is used as an internal code.

However, for example, in the DVB-T standard, a value of a synchronous byte for every 8 packets is 0xB8 once, and 0x47 thereafter. In addition, an eleven-packet delay occurs in the byte interleaver or byte de-interleaver. Therefore, when the delay is considered, the synchronous byte of the decoded data is replaced with 0x47 or 0xb8.

In addition, the present disclosure may also be applied to a receiving device compliant with a standard in which an RS code is used as an external code and an LDPC code is used as an internal code. In this case, in the above described embodiments, LDPC decoding is performed instead of Viterbi decoding. Further, the present technology may also be applied to a receiving device compliant with the DVB-T2 standard, the DVB-C2 standard, and the DVB-S2 standard in which a BCH code is used as an external code and an LDPC code is used as an internal code. In this case, in the above described embodiments, LDPC decoding instead of Viterbi decoding and BCH decoding instead of RS decoding are performed.

It is noted that the present technology may also be configured as below.

(1)

A receiving device that receives data encoded with "n" number ("n" is an integer greater than 1) of codes, wherein regarding the data, "a" piece ("a" is an integer equal to or greater than 1) of data out of original data before encoding or the data encoded with the "n" number of codes are encoded by encoding with a subsequent code after an interleaving process is performed, the receiving device includes "n" number of decoding units, "a" number of delay unit, a reliability increasing unit, and a decode stop determination unit, the "n" number of decoding units decode the respective "n" number of codes, the "a" number of delay unit performs inverse conversion of the interleaving process on the data output from the decoding units, corresponding to the codes for encoding each "a" piece of data on which the interleaving process is performed, the reliability increasing unit controls decoding of the encoded data to improve reliability of decoding results by using a part or all of the decoding results of the respective decoding units or a part or all of the data output from the respective delay units, and the decode stop determination unit determines whether or not to stop subsequent decoding on the encoded data as a processing target by controlling decoding by the reliability increasing unit using a part or all of the respective decoding results of the decoding units or a part or all of the data output from the delay units.

(2)

The receiving device according to (1), further including:

an inverse conversion delay unit configured to perform inverse conversion of related process in the delay units on the respective decoding results of the decoding units; and an encoding unit configured to perform related encoding, wherein the reliability increasing unit controls first decoding of the encoded data to improve reliability of the decoding results by using the data which is processed in the inverse conversion delay unit and encoding unit in an earlier stage.

(3)

The receiving device according to (1) or (2), wherein a plurality of error correction processing units including the "n" number of decoding units, the "a" number of delay unit, and the reliability increasing unit are connected in series and there is the decode stop determination unit between the error correction processing units, and the reliability increasing unit controls first decoding of the encoded data to improve the reliability of the decoding results by using the decoding results of decoding in the decoding unit of the error correction processing unit in an earlier stage, and the decode stop determination unit controls to stop processes from the decoding results of the error correction processing unit in an earlier stage to a part or all of the error correction processing unit in a later stage, or to stop a part of the error correction processing unit in a later stage.

(4)

The receiving device according to (3), further including:

an inverse conversion delay unit, between the error correction processing units, configured to perform inverse conversion of related process in the delay units on the decoding results obtained by decoding by the respective decoding units in the error correction processing unit in an earlier stage, and an encoding unit configured to perform related encoding, wherein the reliability increasing unit controls first decoding of the encoded data to improve reliability of the decoding results by using data processed in the inverse conversion delay unit and encoding unit in an earlier stage.

(5)

The receiving device according to (2), wherein as it is assumed that the "n" is 2, an external code is Reed-Solomon (RS) code, an internal code is a convolutional code, the "a" is 1, and data, which is RS coded data to which convolutional interleaving and encoding with a convolutional code are performed, is a processing target, a convolutional de-interleaver is included as the delay unit, a convolutional interleaver is included as the inverse conversion delay unit, and the decode stop determination unit controls to stop decoding of the data as a processing target when decoding on all of data in the convolutional interleaver by an RS decoder is all succeeded or failed.

(6)

The receiving device according to any of (1) to (5), wherein as it is assumed that the "n" is 2, an external code is a Reed-Solomon (RS) code, an internal code is a convolutional code, and data, which is RS coded data to which convolutional interleaving and encoding with a convolutional code are performed, is a processing target, a convolutional de-interleaver is included as the delay unit, the reliability increasing unit controls first decoding of the encoded data to improve reliability of the decoding results by using data equivalent to data which passes through a zero delay branch of outputs of the convolutional de-interleave among the decoding results from the RS decoder, and the decode stop determination unit controls to operate only a convolutional code decoder and a convolutional de-interleaver again when RS decoding of data of an amount of a RS code word input to the RS decoder is succeeded and, on the other hand, to stop decoding of the data as a processing target when RS decoding of the data in amount of a RS code word input to the RS decoder is failed.

(7)

The receiving device according to (4), wherein as it is assumed that the "n" is 2, an external code is an Reed-Solomon (RS) code, an internal code is a convolutional code, the "a" is 1, data, which is RS coded data to which convolutional interleaving and encoding with convolutional code are performed, is a processing target, a convolutional de-interleaver is included as the delay unit, a convolutional interleaver is included as the inverse conversion delay unit, and the decode stop determination unit controls to stop a part or all of decoding of the data as a processing target when decoding by an RS decoder on all the data in the convolutional interleaver is all succeeded or all failed.

(8)

The receiving device according to any of (1) to (7), further including a replacement unit configured to replace a value of a position corresponding to a position of a known value of the encoded data, among the encoded data as the decoding result after delaying by the delay unit, with the known value, wherein the reliability increasing unit controls decoding of the encoded data to improve reliability of the decoding results by using a decoding result which is not delayed by the delay unit among the decoding results which are replaced by the replacement unit.

(9)

The receiving device according to any of (1) to (8), wherein the reliability increasing unit controls decoding so as to convert a likelihood as the encoded data into a likelihood that is closest to 0 or 1 on the basis of the decoding result that is not delayed by the delay unit and to decode the converted likelihood.

(10)

The receiving device according to any of (1) to (9), wherein the decoding is Viterbi decoding, and the reliability increasing unit controls Viterbi decoding in a manner that a state in a trellis in Viterbi decoding is determined on the basis of a decoding result that is not delayed by the delay unit and reliability of the state becomes the highest.

(11)

The receiving device according to any of (1) to (10), further including a calculating unit configured to calculate a number of bit errors by using one of decoding results of decoding while decoding same data more than one time.

(12)

A receiving method of a receiving device that receives data encoded with "n" number of ("n" is an integer greater than 1) of codes, the receiving method including the steps of:

encoding the data by encoding, with a subsequent code, "a" piece ("a" is an integer equal to or greater than 1) of data out of original data before encoding or the data encoded with the "n" number of codes after an interleaving process is performed;

decoding the respective "n" number of codes;

performing inverse conversion of the interleaving process on the data output corresponding to the codes for encoding each "a" piece of data on which the interleaving process is performed;

controlling decoding of the encoded data to improve reliability of decoding results by using a part or all of the decoding results using the respective "n" number of codes or a part or all of the data on which inverse conversion of the interleaving process is performed respectively; and determining whether or not to stop subsequent decoding on the encoded data as a processing target by controlling decoding of the encoded data by using a part or all of the decoding results using the respective "n" number of codes or a part or all of the data on which inverse conversion of the interleaving process is performed respectively.

(13)

A program that causes a computer, which controls a receiving device that receives data encoded with "n" number ("n" is an integer greater than 1) of codes, to execute a process including the steps of:

encoding the data by encoding, with a subsequent code, "a" piece ("a" is an integer equal to or greater than 1) of data out of original data before encoding or the data encoded with the "n" number of codes after an interleaving process is performed;

decoding the respective "n" number of codes;

performing inverse conversion of the interleaving process on the data output corresponding to the codes for encoding each "a" piece of data on which the interleaving process is performed;

controlling decoding of the encoded data to improve reliability of decoding results by using a part or all of the decoding results using the respective "n" number of codes or a part or all of the data on which inverse conversion of the interleaving process is performed respectively; and determining whether or not to stop subsequent decoding on the encoded data as a processing target by controlling decoding of the encoded data by using a part or all of the decoding results with the respective "n" number of codes or a part or all of the data on which inverse conversion of the interleaving process is performed respectively.

It is noted that the present embodiment is not limited to the above described embodiments and various changes may be made within a scope of the present disclosure.

REFERENCE SIGNS LIST

11 Receiving device
12 Antenna
13 Tuner
14 Demodulation unit
15 Error correction unit
16 Decoder
17 Output unit
21 Control unit
22 Likelihood converting unit
23 Viterbi decoding unit
24 Byte de-interleaver
25 RS decoding unit
26 Byte interleaver
27 Convolutional encoding unit
28 Decode stop determination unit
29 Bit error counter
30 State generating unit
31 Synchronous byte processing unit
32 Delay unit
33 Selector
34 Selector
36 Hierarchical byte de-interleaver
37 Hierarchical energy inverse dispersion unit
38 Hierarchical energy dispersion unit
39 Hierarchical byte interleaver
40 Hierarchy synthesizing unit
41 Hierarchy separating unit

The invention claimed is:

1. A receiving device comprising:
a receiver that receives data encoded with "n" number ("n" is an integer greater than 1) of codes,
wherein
regarding the data, "a" piece ("a" is an integer equal to or greater than 1) of data out of original data before encoding or the data encoded with the "n" number of codes are encoded by encoding with a subsequent code after an interleaving process is performed,
the receiver includes "n" number of decoding circuitries, "a" number of delay circuitries, a reliability increasing circuitry, and a decode stop determination circuitry,
the "n" number of circuitries decode the respective "n" number of codes,
the "a" number of delay circuitries performs inverse conversion of the interleaving process on the data output from the decoding circuitries, corresponding to the codes for encoding each "a" piece of data on which the interleaving process is performed,
the reliability increasing circuitry controls decoding of the encoded data to improve reliability of decoding results by using a part or all of the decoding results of the respective decoding circuitries or a part or all of the data output from the respective delay circuitries, and
the decode stop determination circuitry determines whether to stop subsequent decoding on the encoded data as a processing target by controlling decoding by the reliability increasing circuitry using a part or all of the respective decoding results of the decoding circuitries or a part or all of the data output from the delay circuitries.

2. The receiving device according to claim 1, further comprising:
an inverse conversion delay circuitry configured to perform inverse conversion of related process in the delay circuitries on the respective decoding results of the decoding circuitries; and
an encoding circuitry configured to perform related encoding,
wherein the reliability increasing circuitry controls first decoding of the encoded data to improve reliability of the decoding results by using the data which is processed in the inverse conversion delay circuitry and encoding circuitry in an earlier stage.

3. The receiving device according to claim 1, wherein
a plurality of error correction processing circuitries including the "n" number of decoding circuitries, the "a" number of delay circuitries, and the reliability increasing circuitry are connected in series and there is the decode stop determination circuitry between the error correction circuitries, and
the reliability increasing circuitry controls first decoding of the encoded data to improve the reliability of the decoding results by using the decoding results of decoding in the decoding circuitry of the error correction processing circuitry in an earlier stage, and the decode stop determination circuitry controls to stop processes from the decoding results of the error correction processing circuitry in an earlier stage to a part or all of the error correction processing circuitry in a later stage, or to stop a part of the error correction processing circuitry in a later stage.

4. The receiving device according to claim 3, further comprising:
an inverse conversion delay circuitry, between the error correction processing circuitries, configured to perform inverse conversion of related process in the delay circuitries on the decoding results obtained by decoding by the respective decoding circuitries in the error correction processing circuitry in an earlier stage, and
an encoding circuitry configured to perform related encoding,
wherein the reliability increasing circuitry controls first decoding of the encoded data to improve reliability of the decoding results by using data processed in the inverse conversion delay circuitry and encoding circuitry in an earlier stage.

5. The receiving device according to claim 2, wherein
as it is assumed that the "n" is 2, an external code is Reed-Solomon (RS) code, an internal code is a convolutional code, the "a" is 1, and data, which is RS coded data to which convolutional interleaving and encoding with a convolutional code are performed, is a processing target,
a convolutional de-interleaver is included as one of the delay circuitries,
a convolutional interleaver is included as the inverse conversion delay circuitry, and
the decode stop determination circuitry controls to stop decoding of the data as a processing target when decoding on all of data in the convolutional interleaver by an RS decoder is all succeeded or failed.

6. The receiving device according to claim 1, wherein
as it is assumed that the "n" is 2, an external code is a Reed-Solomon (RS) code, an internal code is a convolutional code, and data, which is RS coded data to which convolutional interleaving and encoding with a convolutional code are performed, is a processing target,
a convolutional de-interleaver is included as one of the delay circuitries,
the reliability increasing circuitry controls first decoding of the encoded data to improve reliability of the decoding results by using data equivalent to data which passes through a zero delay branch of outputs of the convolutional de-interleave among the decoding results from the RS decoder, and
the decode stop determination circuitry controls to operate only a convolutional code decoder and a convolutional de-interleaver again when RS decoding of data of an amount of a RS code word input to the RS decoder is succeeded and, on the other hand, to stop decoding of the data as a processing target when RS decoding of the data in amount of a RS code word input to the RS decoder is failed.

7. The receiving device according to claim 4, wherein
as it is assumed that the "n" is 2, an external code is an Reed-Solomon (RS) code, an internal code is a convolutional code, the "a" is 1, data, which is RS coded data to which convolutional interleaving and encoding with convolutional code are performed, is a processing target,
a convolutional de-interleaver is included as one of the delay circuitries,
a convolutional interleaver is included as the inverse conversion delay circuitry, and
the decode stop determination circuitry controls to stop a part or all of decoding of the data as a processing target when decoding by an RS decoder on all the data in the convolutional interleaver is all succeeded or all failed.

8. The receiving device according to claim 1, further comprising a replacement circuitry configured to replace a value of a position corresponding to a position of a known value of the encoded data, among the encoded data as the decoding result after delaying by the delay circuitries, with the known value,
wherein the reliability increasing circuitry controls decoding of the encoded data to improve reliability of the decoding results by using a decoding result which is not delayed by the delay circuitries among the decoding results which are replaced by the replacement circuitry.

9. The receiving device according to claim 1, wherein the reliability increasing circuitry controls decoding so as to convert a likelihood as the encoded data into a likelihood that is closest to 0 or 1 on the basis of the decoding result that is not delayed by the delay circuitries and to decode the converted likelihood.

10. The receiving device according to claim 1, wherein
the decoding is Viterbi decoding, and
the reliability increasing circuitry controls Viterbi decoding in a manner that a state in a trellis in Viterbi decoding is determined on the basis of a decoding result that is not delayed by the delay circuitries and reliability of the state becomes the highest.

11. The receiving device according to claim 1, further comprising a calculating circuitry configured to calculate a number of bit errors by using one of decoding results of decoding while decoding same data more than one time.

12. A receiving method of a receiving device that receives data encoded with "n" number of ("n" is an integer greater than 1) of codes, the receiving method comprising:
encoding the data by encoding, with a subsequent code, "a" piece ("a" is an integer equal to or greater than 1) of data out of original data before encoding or the data encoded with the "n" number of codes after an interleaving process is performed;
decoding the respective "n" number of codes;
performing inverse conversion of the interleaving process on the data output corresponding to the codes for encoding each "a" piece of data on which the interleaving process is performed;

controlling decoding of the encoded data to improve reliability of decoding results by using a part or all of the decoding results using the respective "n" number of codes or a part or all of the data on which inverse conversion of the interleaving process is performed respectively; and determining whether to stop subsequent decoding on the encoded data as a processing target by controlling decoding of the encoded data by using a part or all of the decoding results using the respective "n" number of codes or a part or all of the data on which inverse conversion of the interleaving process is performed respectively.

13. A non-transitory computer-readable medium comprising a program that causes a computer, which controls a receiving device that receives data encoded with "n" number ("n" is an integer greater than 1) of codes, to execute a set of operations, the set of operations comprising:

encoding the data by encoding, with a subsequent code, "a" piece ("a" is an integer equal to or greater than 1) of data out of original data before encoding or the data encoded with the "n" number of codes after an interleaving process is performed;

decoding the respective "n" number of codes;

performing inverse conversion of the interleaving process on the data output corresponding to the codes for encoding each "a" piece of data on which the interleaving process is performed;

controlling decoding of the encoded data to improve reliability of decoding results by using a part or all of the decoding results using the respective "n" number of codes or a part or all of the data on which inverse conversion of the interleaving process is performed respectively; and determining whether to stop subsequent decoding on the encoded data as a processing target by controlling decoding of the encoded data by using a part or all of the decoding results with the respective "n" number of codes or a part or all of the data on which inverse conversion of the interleaving process is performed respectively.

* * * * *